(12) United States Patent
Fox et al.

(10) Patent No.: US 9,165,788 B2
(45) Date of Patent: Oct. 20, 2015

(54) POST-DEPOSITION SOFT ANNEALING

(71) Applicant: Novellus Systems, Inc., Fremont, CA (US)

(72) Inventors: Keith Fox, Tigard, OR (US); Bart J. Van Schravendijk, Palo Alto, CA (US); Dong Niu, West Linn, OR (US); Lucas B. Henderson, Rotterdam, NY (US); Joseph L. Womack, Tigard, OR (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 13/857,566

(22) Filed: Apr. 5, 2013

(65) Prior Publication Data

US 2013/0267081 A1     Oct. 10, 2013

Related U.S. Application Data

(60) Provisional application No. 61/621,166, filed on Apr. 6, 2012.

(51) Int. Cl.
*H01L 21/20* (2006.01)
*H01L 21/36* (2006.01)
*H01L 21/324* (2006.01)
(Continued)

(52) U.S. Cl.
CPC .............. *H01L 21/324* (2013.01); *C23C 16/24* (2013.01); *C23C 16/56* (2013.01); *H01L 27/11582* (2013.01)

(58) Field of Classification Search
USPC ................... 438/486, 488, 795; 257/E21.113
See application file for complete search history.

(56) References Cited

U.S. PATENT DOCUMENTS

| 5,399,387 A | 3/1995 | Law et al. |
| 5,589,233 A | 12/1996 | Law et al. |

(Continued)

FOREIGN PATENT DOCUMENTS

| CN | 101071771 A | 11/2007 |
| CN | 101255552 A | 9/2008 |

(Continued)

OTHER PUBLICATIONS

Kim, W., et al., "Multi-Layered Vertical Gate NAND Flash Overcoming Stacking Limit for Terabit Density Storage," 2009 Symposium on VLSI Technology Digest of Technical Papers, 2009, pp. 188-189.

(Continued)

*Primary Examiner* — Charles Garber
*Assistant Examiner* — Abdulfattah Mustapha
(74) *Attorney, Agent, or Firm* — Weaver Austin Villeneuve & Sampson LLP

(57) ABSTRACT

The methods and apparatus disclosed herein concern a process that may be referred to as a "soft anneal." A soft anneal provides various benefits. Fundamentally, it reduces the internal stress in one or more silicon layers of a work piece. Typically, though not necessarily, the internal stress is a compressive stress. A particularly beneficial application of a soft anneal is in reduction of internal stress in a stack containing two or more layers of silicon. Often, the internal stress of a layer or group of layers in a stack is manifest as wafer bow. The soft anneal process can be used to reduce compressive bow in stacks containing silicon. The soft anneal process may be performed without causing the silicon in the stack to become activated.

17 Claims, 17 Drawing Sheets

(51) Int. Cl.
    *H01L 27/115* (2006.01)
    *C23C 16/24* (2006.01)
    *C23C 16/56* (2006.01)

(56) References Cited

U.S. PATENT DOCUMENTS

| | | | |
|---|---|---|---|
| 5,851,602 A | 12/1998 | Law et al. | |
| 6,066,550 A | 5/2000 | Wang | |
| 6,087,278 A | 7/2000 | Kim et al. | |
| 6,207,574 B1 | 3/2001 | Lee | |
| 6,235,650 B1 | 5/2001 | Yao | |
| 6,358,573 B1 | 3/2002 | Raoux et al. | |
| 6,407,011 B1 | 6/2002 | Ikeda et al. | |
| 6,444,277 B1 | 9/2002 | Law et al. | |
| 6,811,831 B1 | 11/2004 | Koutny et al. | |
| 6,818,533 B2 | 11/2004 | Chen et al. | |
| 6,962,859 B2 | 11/2005 | Todd et al. | |
| 7,422,776 B2 | 9/2008 | Yim et al. | |
| 7,479,443 B2 | 1/2009 | Bauer et al. | |
| 7,608,300 B2 | 10/2009 | Bencher et al. | |
| 7,635,651 B2 | 12/2009 | Lee et al. | |
| 7,858,431 B2 | 12/2010 | Isaka et al. | |
| 8,076,250 B1 | 12/2011 | Rajagopalan et al. | |
| 8,318,575 B2 | 11/2012 | Lehnert et al. | |
| 8,709,551 B2 | 4/2014 | Fox et al. | |
| 8,741,394 B2 | 6/2014 | Haverkamp et al. | |
| 8,895,415 B1 | 11/2014 | Fox et al. | |
| 9,028,924 B2 | 5/2015 | Haverkamp et al. | |
| 2001/0007245 A1 | 7/2001 | Weichart | |
| 2002/0011656 A1 | 1/2002 | Swanson et al. | |
| 2004/0011279 A1 | 1/2004 | Joo | |
| 2004/0041239 A1 | 3/2004 | Ruelke et al. | |
| 2004/0087079 A1 | 5/2004 | Chen et al. | |
| 2004/0146661 A1 | 7/2004 | Kapoor et al. | |
| 2005/0040456 A1 | 2/2005 | Specht et al. | |
| 2005/0045099 A1 | 3/2005 | Bencher et al. | |
| 2005/0186686 A1 | 8/2005 | Chen et al. | |
| 2005/0196960 A1* | 9/2005 | Koo et al. | 438/649 |
| 2005/0229848 A1 | 10/2005 | Shinriki et al. | |
| 2005/0233591 A1 | 10/2005 | Schmitt et al. | |
| 2006/0049139 A1 | 3/2006 | Xia et al. | |
| 2006/0204673 A1 | 9/2006 | Takayasu et al. | |
| 2006/0276011 A1* | 12/2006 | Fogel et al. | 438/486 |
| 2007/0059942 A1 | 3/2007 | Hu et al. | |
| 2007/0110918 A1 | 5/2007 | Yuda et al. | |
| 2007/0144215 A1 | 6/2007 | Kharas | |
| 2007/0215877 A1 | 9/2007 | Kato et al. | |
| 2007/0264842 A1 | 11/2007 | Kim | |
| 2008/0020591 A1 | 1/2008 | Balseanu et al. | |
| 2008/0050883 A1 | 2/2008 | Enicks | |
| 2008/0073645 A1 | 3/2008 | Todd et al. | |
| 2008/0113521 A1 | 5/2008 | Tanaka et al. | |
| 2008/0145536 A1 | 6/2008 | Zhang et al. | |
| 2008/0153300 A1 | 6/2008 | Bok | |
| 2008/0202688 A1 | 8/2008 | Wu et al. | |
| 2008/0268176 A1 | 10/2008 | Choi et al. | |
| 2008/0299747 A1 | 12/2008 | Arai et al. | |
| 2009/0022908 A1 | 1/2009 | Yang et al. | |
| 2009/0035927 A1 | 2/2009 | Olsen et al. | |
| 2009/0095221 A1 | 4/2009 | Tam et al. | |
| 2009/0097105 A1 | 4/2009 | Hart et al. | |
| 2009/0104790 A1 | 4/2009 | Liang | |
| 2009/0159119 A1 | 6/2009 | Basol | |
| 2009/0246942 A1 | 10/2009 | Imaeda et al. | |
| 2009/0286402 A1 | 11/2009 | Xia et al. | |
| 2010/0012030 A1 | 1/2010 | Todd et al. | |
| 2010/0102359 A1* | 4/2010 | Khan et al. | 257/194 |
| 2010/0109065 A1* | 5/2010 | Oh et al. | 257/314 |
| 2010/0184302 A1 | 7/2010 | Lee et al. | |
| 2010/0210093 A1 | 8/2010 | Kato et al. | |
| 2011/0018044 A1 | 1/2011 | Lim et al. | |
| 2011/0036168 A1* | 2/2011 | Lin | 73/514.05 |
| 2011/0143019 A1 | 6/2011 | Mosso et al. | |
| 2011/0151142 A1 | 6/2011 | Seamons et al. | |
| 2011/0236594 A1 | 9/2011 | Haverkamp et al. | |
| 2011/0236600 A1 | 9/2011 | Fox et al. | |
| 2012/0142172 A1 | 6/2012 | Fox et al. | |
| 2013/0157466 A1 | 6/2013 | Fox et al. | |
| 2013/0171834 A1 | 7/2013 | Haverkamp et al. | |
| 2013/0316518 A1 | 11/2013 | Hollister et al. | |
| 2014/0357064 A1 | 12/2014 | Fox et al. | |
| 2015/0013607 A1 | 1/2015 | Haverkamp et al. | |

FOREIGN PATENT DOCUMENTS

| | | |
|---|---|---|
| CN | 10149914 A | 4/2009 |
| DE | 101 43 235 A1 | 3/2003 |
| EP | 0 394 054 | 10/1990 |
| JP | 06-240459 A | 8/1994 |
| JP | 2000-208422 | 7/2000 |
| WO | WO 2009/098548 | 8/2009 |
| WO | WO2012/036808 | 3/2012 |
| WO | WO 2013/123143 | 8/2013 |

OTHER PUBLICATIONS

Kim, J., et al., "Novel Vertical-Stacked-Array-Transistor (VSAT) for Ultra-High-Density and Cost-Effective NAND Flash Memory Devices and SSD (Sold State Drive)," 2009 Symposium on VLSI Technology Digest of Technical Papers, 2009, pp. 186-187.

Jang, J., et al., "Vertical Cell Array Using TCAT (Terabit Cell Array Transistor) Technology for Ultra High Density NAND Flash Memory," 2009 Symposium on VLSI Technology Digest of Technical Papers, 2009, pp. 192-193.

Ong, Y. et al., Process Analysis and Optimization on PECVD Amorphous Silicon on Glass Substrate, Journal of Physics: Conference Series, vol. 34, 2006, pp. 812-817.

U.S. Appl. No. 13/671,424, filed Nov. 7, 2012, entitled "In-Situ Deposition of Film Stacks," Haverkamp et al.

U.S. Appl. No. 13/766,696, filed Feb. 13, 2013, entitled "Silicon-Nitride Films for Semiconductor Device Applications," Fox et al.

U.S. Appl. No. 13/478,999, filed May 23, 2012, entitled "PECVD Deposition of Smooth Silicon Films," Hollister et al.

US Office Action dated Nov. 26, 2012 issued in U.S. Appl. No. 12/970,846.

International Search Report and Written Opinion mailed Apr. 9, 2012, issued in Application No. PCT/US2011/047107.

U.S. Appl. No. 14/262,196, filed Apr. 25, 2014, entitled "In-Situ Deposition of Film Stacks," Haverkamp et al.

U.S. Appl. No. 13/907,742, filed May 31, 2013, entitled "Tensile Stressed Doped Amorphous Silicon," Fox et al.

US Final Office Action dated May 16, 2013 issued in U.S. Appl. No. 12/970,846.

US Office Action dated Sep. 11, 2013 issued in U.S. Appl. No. 12/970,846.

US Notice of Allowance dated Jan. 24, 2014 issued in U.S. Appl. No. 12/970,846.

US Office Action dated Feb. 28, 2014 issued in U.S. Appl. No. 13/671,424.

US Notice of Allowance dated Jul. 14, 2014 issued in U.S. Appl. No. 13/671,424.

US Office Action dated Apr. 9, 2013 issued in U.S. Appl. No. 12/970,853.

US Final Office Action dated Aug. 9, 2013 issued in U.S. Appl. No. 12/970,853.

US Notice of Allowance dated Dec. 18, 2013 issued in U.S. Appl. No. 12/970,853.

US Office Action dated Jan. 30, 2014 issued in U.S. Appl. No. 13/313,422.

US Final Office Action dated May 13, 2014 issued in U.S. Appl. No. 13/313,422.

US Office Action dated Feb. 5, 2014 issued in U.S. Appl. No. 13/478,999.

US Final Office Action dated Jul. 2, 2014 issued in U.S. Appl. No. 13/478,999.

US Notice of Allowance dated Jun. 23, 2014 issued in U.S. Appl. No. 13/907,742.

Singapore Search Report and Written Opinion dated Apr. 18, 2013, issued in SG 201102162-3.

(56) References Cited

OTHER PUBLICATIONS

Singapore Search and Examination Report dated Nov. 28, 2013, issued in SG 201102162-3.
PCT International Preliminary Report on Patentability and Written Opinion dated Mar. 28, 2013, issued in PCT/US2011/047107.
Singapore Search and Examination Report dated Mar. 13, 2014, issued in SG 201301550-8.
PCT International Search Report and Written Opinion dated Jun. 3, 2013, issued in PCT/US2013/026069.
PCT International Preliminary Report on Patentability and Written Opinion dated Aug. 28, 2014, issued in PCT/US2013/026069.
Bahari et al., (Jul./Aug. 2006) "Growth of a stacked silicon nitride/silicon oxide dielectric on Si (100)," *J. Vac. Sci. Technol.* B 24(4):2119-2123.
"Diaphragm Valves," (Oct. 2003) *Microelectronics Product Line, Catalog 4505/USA*, Parker Hannifin Corporation, pp. 1-49.
Han et al. (Jun. 1994) "Modeling the Properties of PECVD Silicon Dioxide Films Using Optimized Back-Propagation Neural Networks," IEE Transaction on Components, Packaging, and Manufacturing Technology—Part A, 17(2):174-182.
Kim et al., (2013) "Double antireflection coating layer with silicon nitride and silicon oxide for crystalline silicon solar cell," *J. Electroceram*, 30:41-45.
Moisan, M., et al., (Oct. 1987) "New surface wave launchers for sustaining plasma columns at submicrowave frequencies (1-300 MHz)" *Rev. Sci. Instrum.* 58(10):1895-1900.
Hoogeland et al., (2009) "Plasma-assisted atomic layer deposition of TiN/Al$_2$O$_3$ stacks for metal-oxide-semiconductor capacitor applications," *Journal of Applied Physics* 106, 114107-1-114107-7, 7pp.
Schmidt et al., (2001) "Surface Passivation of silicon solar cells using plasma-enhanced chemical-vapour-deposited SiN films and thin thermal SiO$_2$/plasma SiN stacks." *Semicond. Sci. Technol.*, 16:164-170.
Schultz et al., (2005) "Silicon Oxide/Silicon Nitride Stack System for 20% Efficient Silicon Solar Cells," *IEEE*, pp. 872-876.
Su, Chen-Yi, et al., (2012) "Deposition and characterization of MgO/Si gate stacks grown by molecular beam epitaxy," *Thin Solid Films* 520:4508-4511.
Viana et al. (Jun. 2001) "Analysis of SiO$_2$ Thin Film Deposited by PECVD using an Oxygen-TEOS-Argon Mixture," *Brazilian Journal of Physics*, 31(2):299-303.
Zohni et al., (2007) "Investigating thin film stresses in stacked silicon dioxide/silicon nitride structures and quantifying their effects on frequency response," *J. Micromech. Microeng.* 17:1042-1051.
US Notice of Allowance dated Dec. 15, 2014 issued in U.S. Appl. No. 13/671,424.
US Notice of Allowance dated Feb. 3, 2015 issued in U.S. Appl. No. 13/671,424.
US Office Action dated Mar. 16, 2015 issued in U.S. Appl. No. 13/766,696.
US Office Action dated Nov. 6, 2014 issued in U.S. Appl. No. 13/478,999.
US Notice of Allowance dated Apr. 20, 2015 issued in U.S. Appl. No. 13/478,999.
US Notice of Allowance dated Oct. 16, 2014 issued in U.S. Appl. No. 13/907,742.
Chinese Office Action [official action and description in English] dated Mar. 26, 2015 issued in CN 201180044067.X.
Gatz, S., et al., (2008) "Thermal stability of amorphous silicon/silicon nitride stacks for passivating crystalline silicon solar cells," Applied Physics Letters 93:(173502):pp. 1-3.
Keipert-Colberg, Sinje, et al., (Sep. 5-9, 2011) "Investigation of a PECVD silicon oxide/silicon nitride passivation system concerning process influences," Presented at the 26th European PV Solar Energy Conference and Exhibition, Hamburg, Germany, pp. 1-4.

* cited by examiner

POST-DEPOSITION SOFT ANNEALING

CROSS REFERENCE TO RELATED APPLICATION

This application claims benefit of U.S. Provisional Patent Application Ser. No. 61/621,166, filed Apr. 6, 2012, and titled "POST-DEPOSITION SOFT ANNEALING," which is incorporated by reference herein in its entirety and for all purposes.

BACKGROUND

Various thin film layers for semiconductor devices may be deposited by chemical vapor deposition (CVD) and/or plasma-enhanced chemical vapor deposition (PECVD) processes. Some memory devices, such as NAND flash memory, are arranged in two-dimensional arrays. Because such memory devices are limited to a planar arrangement, die size and memory density parameters may constrain the total memory capacity of the device. In turn, moving to larger die sizes to expand memory capacity may comparatively increase the cost of the memory device, which may delay adoption of larger capacity memory devices. Certain approaches for arranging memory gates into three-dimensional (3D) arrays have been proposed. Some of these approaches incorporate transistors formed by patterning stacks of alternating film composition. FIG. 1 schematically shows an example film stack 100 including alternating layers of first film 102 and second film 104 on a substrate 106. These 3D arrays are sometimes utilized to form vertically integrated memory (VIM) structures.

Oftentimes, the unit layers used to form a VIM structure on a substrate have an as-deposited internal stress. In many cases the as-deposited internal stress is compressive. When many layers are positioned on top of one another, this internal stress may build up, thereby causing the coated substrate to bow instead of being flat. This bowing is undesirable because it can make subsequent processing more difficult. When the bow of a substrate exceeds a certain level, the substrate may be unusable.

SUMMARY

Certain embodiments herein relate to methods and apparatus for reducing the bow in multilayer stacks fabricated on semiconductor substrates. These methods generally relate to a low temperature "soft annealing" process. A soft anneal provides various benefits. Fundamentally, it reduces the internal stress in one or more silicon layers of a work piece. Typically, though not necessarily, the internal stress is a compressive stress. A particularly beneficial application of a soft anneal is in reduction of internal stress in a stack containing two or more layers of silicon. Often, the internal stress of a layer or group of layers in a stack is manifest as wafer bow. The soft anneal process can be used to reduce compressive bow in stacks containing silicon. The soft anneal process may be performed without causing the silicon in the stack to become activated.

In one aspect of the embodiments herein, a method of preparing a stack structure for an electronic device on a semiconductor substrate is provided. The method includes depositing a stack of at least one repeating group, the group having two or more layers, where at least two of the layers in the group are of different materials, the material of at least one of the alternating layers is silicon, the stack includes at least about four layers, and each layer is of substantially similar thickness, performing a soft anneal on the stack to reduce internal stress in the stack, patterning the stack by defining a pattern on the stack and vertically etching the stack to impart the pattern to the stack, selectively etching the patterned stack to selectively remove portions of at least one of the different materials in the stack, and activating the silicon in at least one of the alternating layers to convert the silicon to a polycrystalline state, where the soft anneal is performed under conditions that do not activate the silicon in the at least one of the layer in the group.

The soft anneal may be performed prior to patterning and/or prior to etching. In certain cases, the stack includes alternating layers of doped silicon and a dielectric material. In other cases, the stack includes alternating layers of doped silicon and undoped silicon. Typically, the silicon deposited in at least one of the layers in the group is amorphous or microcrystalline silicon. The thickness of the stack may be between about 1-6 micrometers in certain implementations. The thickness of each layer of silicon in the stack may be between about 10-1000 angstroms. In many cases, the internal stress in the stack produces a bow in the semiconductor substrate prior to performing the soft anneal. This bow may be at least about 150 micrometers in some embodiments.

The soft anneal may be conducted under certain specified conditions. For example, the soft anneal may be conducted under conditions that do not permit more than about $1 \times 10^{19}$ atoms/cm3 of dopant to diffuse into an undoped silicon layer. In some cases, the soft anneal is conducted at a temperature between about 550-750° C. for a duration of between about 1 second and 7 minutes. The soft anneal may be performed in a rapid thermal annealing chamber in some instances. Selectively etching the patterned stack may be performed by a wet etching process. In some embodiments, activating the silicon includes heating the silicon to a temperature of about 750° C. or higher. Oftentimes, the stack will form a portion of a memory device. This memory device may be a vertically integrated memory device in certain implementations.

In another aspect of the embodiments herein, a system is provided for preparing a stack structure for an electronic device on a semiconductor substrate. The system may include (a) a multi-chamber apparatus including at least one PECVD chamber for depositing at least one layer of the stack, and at least one soft anneal chamber, and (b) a controller having instructions for (i) depositing a stack of at least one repeating group, the group having two or more layers, where at least two of the layers in the group are different materials, the material of at least one of the layers in the group is silicon, and where the stack comprises at least about four layers, each of substantially similar thickness, (ii) performing a soft anneal on the stack to reduce internal stress in the stack, (iii) patterning the stack by defining a pattern on the stack and vertically etching the stack to impart the pattern to the stack; (iv) selectively etching the patterned stack to selectively remove portions of at least one of the different materials in the stack; and (v) activating the silicon in the at least one alternating layer to convert the silicon to a polycrystalline state, where the instructions for performing the soft anneal include instructions for performing the soft anneal under conditions that do not activate the silicon in the at least one layer in the group.

The controller may also include instructions for receiving the semiconductor substrate from outside the system and transferring the substrate from one chamber to another in the multi-chamber apparatus. Further, the controller may have instructions for controlling a temperature profile of the substrate during the soft anneal, as well as instructions for controlling the duration of the soft anneal. The controller may have instructions for performing the soft anneal prior to the patterning, and/or prior to etching, as well as instructions for performing the activating after selectively etching. In certain embodiments, the controller may have instructions for depositing alternating layers of doped silicon and a dielectric material. In other embodiments, the controller has instructions for depositing alternating layers of doped silicon and undoped silicon. The thickness of the individual layers, as well as the thickness of the overall stack, may be controlled by the controller. In one embodiment, the controller has instructions for depositing each layer of silicon in the stack to a thickness of between about 10-1000 angstroms. Similarly, the controller may have instructions for depositing the stack to a total thickness between about 1-6 micrometers. The controller may also control the temperature and duration during the soft anneal. In a particular example, the controller has instructions for conducting the soft anneal at a temperature between about 550-750° C., for a duration between about 1 second and 7 minutes. Further, the controller may have instructions for fabricating at least a portion of a vertical integrated memory device from the activated and selectively etched stack. In certain cases, the soft anneal chamber may be a rapid thermal annealing chamber.

These and other features will be described below with reference to the associated drawings.

DETAILED DESCRIPTION

Figure 1:
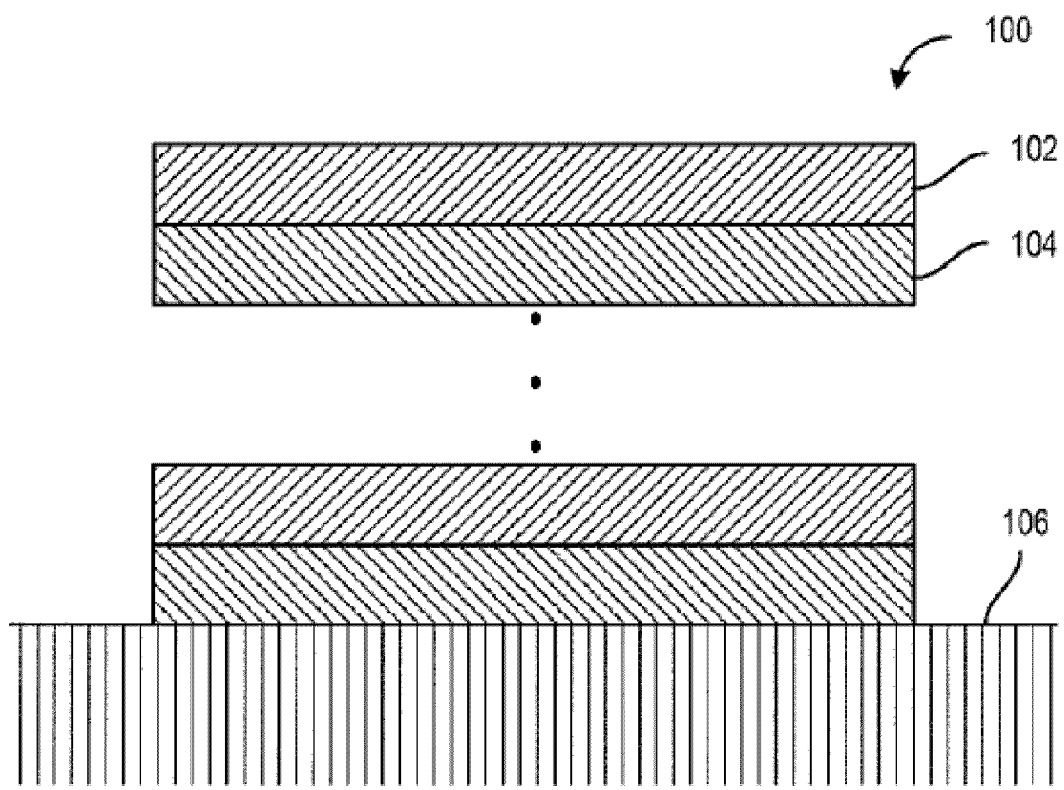
FIG. 1 shows an example film stack having alternating layers of material.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. Further, the terms "electrolyte," "plating bath," "bath," and "plating solution" are used interchangeably. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

When silicon is discussed herein without qualification, it is intended that the silicon may have any morphological form, e.g., amorphous or polycrystalline silicon. Frequently, the as-deposited silicon does not initially possess a polycrystalline morphology. Rather its initial, as-deposited, morphology is amorphous or microcrystalline (i.e., a structure having small grains of crystalline Si within an amorphous phase). In the context of device fabrication, the as-deposited silicon is sometimes referred to as "unactivated." It may be subsequently "activated" to convert it into polycrystalline silicon or "polysilicon." Activation is typically accomplished by heating in a furnace or heating via a rapid thermal annealing (RTA) process. In many device fabrication schemes, unactivated silicon is subjected to some post-deposition processing before it is activated.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments VIM structures, due to their 3D arrangement, allow for an increased total memory capacity per unit of die area as compared to 2D memory structures. VIM structures are typically formed from alternating layers of material. As used herein, the multilayer stacks include alternating layers of two or more materials, at least one of which includes silicon. In certain cases these materials may be doped and undoped silicon, or doped silicon and a dielectric material, or a combination of these materials. One non-limiting example of a dielectric material is an oxide such as silicon oxide. In some embodiments, a repeating unit of three different layers may be used in a stack. For example, in a particular embodiment, the stack comprises repeating layers of doped silicon, undoped silicon, and dielectric.

Typically, the pairs of alternating layers (e.g., a layer pair of doped silicon and dielectric, or a layer pair of undoped silicon and doped silicon) are provided as discrete pairs which may be interleaved with one another to the extent appropriate for the particular application under consideration. Thus, for example, a multilayer stack may primarily contain alternating layers of dielectric and doped silicon, with some inserted or interleaved pairs of layers of doped silicon and undoped silicon. In another example, the multilayer stack primarily contains pairs of undoped silicon and doped silicon, with one or more pairs of dielectric and doped silicon interleaved in the overall stack.

Typically, one or more or all of the silicon layers of the multilayer stack are deposited by a chemical vapor deposition process such as a plasma enhanced chemical vapor deposition (PECVD) process. In some embodiments, all layers are deposited by PECVD.

The stacks described herein sometimes have a silicon oxide layer between silicon layers. In some embodiments, the oxide layer is comprised of a film containing silicon and oxygen. In one example, a PECVD film may be made by reaction of a silicon containing precursor and a source of oxygen. Non-limiting examples include silane and tetra-ethylorthosilicate (TEOS) as the silicon containing precursors, and molecular oxygen, $O_2$, and $N_2O$ as the oxygen sources. Other chemical elements may be included to modulate a film's composition to enhance certain film properties. For example, elements such as carbon, hydrogen, or nitrogen may be introduced. The composition of one non-limiting example of a nitride layer in the stack as measured by Rutherford Backscattering Spectrometry (RBS) was silicon at 37.6 atomic %, nitrogen at 49 atomic %, and hydrogen at 13.4 atomic %.

The thickness of the individual layers is typically between about 10-1,000 Å, or between about 200-550 Å. These thicknesses are suitable for VIM and other applications. In such embodiments, the overall height of the complete multilayer stack may be between about 1-6 µm, or between about 1.5-3 µm. In certain cases, the layers are each of substantially similar thickness (e.g., within about 50%), and in some cases, the thickness of the individual layers is even more similar (e.g., within about 20%).

In VIM applications, the dielectric layers generally serve as insulating layers between the vertically stacked devices. In stacks employing the dielectric and doped silicon pairs, the doped silicon layers serve as gate electrodes. In stacks containing the undoped and doped silicon pairs, the undoped silicon layers serve as sacrificial layers which are subsequently etched and replaced with an oxide or other dielectric and the doped silicon layers, which remain after etch, serve as insulating layers.

As mentioned above, silicon, whether doped or undoped, is typically deposited in an amorphous or microcrystalline state and is only subsequently activated to assume its final polycrystalline state (sometimes referred to as polysilicon). In various applications, it is intended that the pre-activated state remains intact, without conversion to the polycrystalline state, during multiple steps following deposition. In some fabrication schemes, this is because the etch selectivity between doped silicon and undoped silicon is greater when the silicon is in its pre-activation state than when it is in its activated state. Therefore, it may be important in some applications (such as VIM applications) to not increase the temperature or otherwise apply thermal energy to a level that would activate the as-deposited silicon prior to patterning and etching.

Patterning typically takes place after a hard mask (e.g., an ashable hard mask such as an amorphous carbon layer) is deposited over the stack. The mask may then be lithographically patterned. In certain cases, patterning is accomplished through a photolithographic process. In other cases, patterning is achieved through an electron beam lithography process. The resulting vertically etched stack structures will have dimensions appropriate for the particular application for which they will be used (e.g., VIM applications).

After patterning, the stack may be etched to partially or fully remove one or more layers of the stack (e.g., sacrificial layers of undoped silicon) while substantially preserving the doped silicon. This selective etching may be primarily horizontal in direction and produces an undercut structure such as a fishbone structure. A wet etch may be employed to selectively remove (wholly or partially) a layer or layers from the stack. Examples of wet etchants include hydrofluoric acid (including buffered versions of the acid), potassium hydroxide (KOH) and tetramethyl ammonium hydroxide (TMAOH). In vertical memory applications, a suitable dielectric, for example an oxide, may be deposited in the openings made by the removal of the undoped Si layers.

After patterning and etching, the amorphous or microcrystalline silicon is activated to convert it to its polycrystalline state. The polycrystalline state of doped silicon has significantly better electrical properties, most notably lower resistivity, than the pre-activation silicon.

Activation is typically accomplished by heating the amorphous or microcrystalline silicon to a controlled, elevated temperature for a controlled duration. In many cases activation occurs at a temperature of about 750° C. or higher. While lower temperatures may be used for the activation anneal, these lower temperatures typically require much longer times to complete the transition. This heating may be performed for a few seconds or longer, as necessary for the particular temperature and application. In some cases activation is accomplished using a laser crystallization process. Polysilicon often has an average grain size of about 10 nanometers to about 10 micrometers, although other grain sizes may be achieved.

A significant challenge encountered when depositing multilayer stacks (e.g., stacks containing many layers of doped and undoped silicon or layers of doped silicon and dielectric) is that these layers exhibit significant internal stress as-deposited. This internal stress causes the entire wafer to change shape through bowing. The bow of a wafer is measured as the difference in elevation between the center of the wafer and the perimeter of the wafer when the wafer is positioned horizontally. This bowing occurs at least in part because each of these three materials (dielectric and undoped/doped silicon) has a significant compressive internal stress. Because each layer in a stack contributes to the overall stress and bow of the wafer, stacks having more layers exhibit more stress and are more prone to bowing. Single layer films and stacks having only a few layers are much less likely to exhibit bowing problems. As a consequence, a wafer containing a stack of these materials deposited on a single side of the wafer will have a dome shape in which the stack is on the top or outer surface of the dome and the underlying substrate is on the bottom or inner surface of the dome. If the bow shift is sufficiently large in a given wafer, it can result in a number of problems. One of these problems is that it is difficult to use a conventional wafer processing apparatus, such as a wafer chuck, to conduct subsequent processing on a bowed wafer. A severely bowed wafer is very difficult to properly register to the extent required for photolithography, as this process requires precise optical focusing at precise locations on the substrate. When a wafer is bowed, the lithographic beam may try to focus on one part of the wafer but end up exposing a different part of the wafer due to the wafer's irregular shape. Further, the individual dies on the bowed wafer may not be properly processed in post stack deposition operations. For many applications, a wafer with a bow of greater than about 350 µm and more typically 150 µm is not deemed suitable for processing.

Certain techniques for controlling internal stress and the associated bow are known. However, many of these techniques require tuning deposition conditions within an available process window during deposition of the individual layers. The tuning tailors the internal stress of the deposited layers and reduces the bow accordingly. Unfortunately, many types of layers, including those of some VIM stacks, must be deposited under conditions that are subject to very narrow process windows. In other words, there is very little flexibility for tuning the deposition conditions to reduce bowing. If the process conditions were to be adjusted to address bowing considerations, the electrical, chemical, and/or mechanical properties of the layers would suffer. Among the electrical properties that may suffer are dielectric breakdown voltage and resistance to leakage current. Therefore, in order to deposit high-quality layers having suitable electrical properties, there exists a need for a method of reducing the bow of a wafer having a stack deposited thereon without activating the silicon. The methods and apparatus described herein use a soft anneal process to control bowing, thereby allowing manufacturers to meet stringent bow tolerances while maintaining extremely high quality multilayer stacks.

Methods

The methods disclosed herein concern a process that may be referred to as a "soft anneal." A soft anneal provides various benefits. Fundamentally, it reduces the internal stress in one or more silicon layers of a work piece. Typically, though not necessarily, the internal stress is a compressive stress. A particularly beneficial application of a soft anneal is in reduction of internal stress in a stack containing two or more layers of silicon. Often, the internal stress of a layer or group of layers in a stack is manifest as wafer bow, as described above. The soft anneal process can be used to reduce compressive bow in stacks containing silicon.

Figure 2:
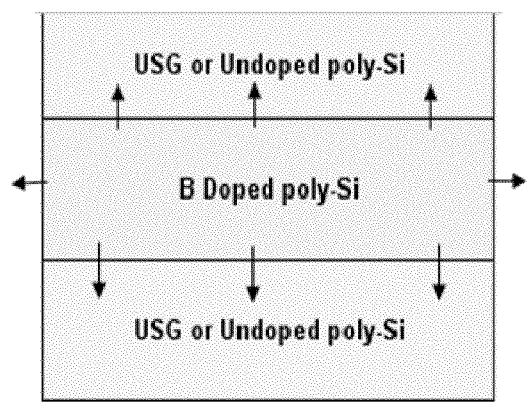
FIG. 2 depicts boron migration out of a boron doped polysilicon layer into surrounding layers.

The conditions of the soft anneal reduce internal stress (e.g., compressive stress) without activating the as-deposited amorphous or microcrystalline silicon. Therefore, after the stack is deposited, its bow is reduced to allow additional processing (e.g., patterning and selective etching) prior to activation to convert the as-deposited silicon in the stack to polysilicon. Additionally, the conditions of the soft anneal may be chosen to prevent substantial diffusion of dopant from doped silicon into adjacent layers of dielectric or undoped silicon. In other words, the soft anneal is conducted at a sufficiently low temperature for a sufficiently short time, the dopant atoms do not diffuse to a degree that would impact the performance of the devices being fabricated. Those of skill in the art understand the limits of acceptable diffusion and how to conduct a process within these limits. FIG. 2 illustrates an example of such diffusion. Here, boron from the boron doped poly silicon layer is shown diffusing up and down into adjacent layers of undoped silicon glass (USG) or undoped polysilicon, and outwards into adjoining structures. In some applications, in order to allow successful integration of the doped-poly/undoped poly stack there should be about 1E+19 atoms/$cm^3$ or less of dopant diffused into the undoped poly layer. Among the dopants commonly used in the doped silicon layers are boron, phosphorus, and arsenic.

In general, the conditions of a soft anneal will be characterized by a temperature at which the stack is heated and an associated time during which the heating is applied to the stack. The temperature and time of the soft anneal may be selected based on various parameters including the composition of the layers in the stack, the number of such layers, the thickness of such layers, etc. As mentioned, the desired shape of the processed wafer (e.g., substantially flat or with a defined degree of bow) may also be considered when setting soft anneal conditions.

As noted, the soft anneal is typically conducted under conditions that do not activate the as-deposited silicon. The range of temperatures for a soft anneal is, e.g., above the deposition temperature for the stack layers and below the temperature at which doped polysilicon is activated. The activation temperature is typically about 750° C. or slightly higher. In some embodiments, the PECVD deposition temperature for silicon is about 550° C.

In certain embodiments, the temperature of the soft anneal is about 750° C. or less. In some embodiments, the temperature of the soft anneal is about 700° C. or less. In other embodiments, the temperature of the soft anneal is about 650° C. or less, or about 600° C. or less. For certain applications, the soft anneal is conducted at a temperature of between about 550° C. and about 750° C. The duration of the soft anneal depends upon the temperature of the soft anneal and the other parameters mentioned above. In some embodiments, at about 750° C., the soft anneal may be conducted for about 1 second to about 30 seconds. At about 700° C., the soft anneal may be conducted for a duration of about 30 seconds to about 60 seconds. At a temperature of about 650° C., the soft anneal may be conducted for duration of about 1 to about 15 minutes. In a specific example, the soft anneal is conducted at a temperature of about 650° C. for about 1 to 7 minutes. Generally, oxide containing stacks require a longer time to anneal than corresponding undoped silicon containing stacks. For example, the anneal of an oxide containing stack may be conducted for a duration between about 15 seconds to about 18 minutes (again depending on thickness and other parameters) as opposed to a corresponding undoped silicon containing stack which may anneal for a duration between about 1 second to about 15 minutes.

In certain embodiments, the soft anneal is conducted using a temperature program that includes various temperature features; e.g., temperature ramps, plateaus, oscillations, holds, etc. In some cases, the heating rate and cooling rate are bounded. As an example, heating may be performed at a rate between about 75-250° C./s, and/or cooling may be performed at a rate between about 35-90° C./s. Additionally or alternatively, the takeoff temperature (i.e., the initial temperature at the beginning of the anneal process) may be limited to a specific temperature (e.g., about 550° C.) or temperature range (e.g., between about 525-575° C.).

Figure 3:
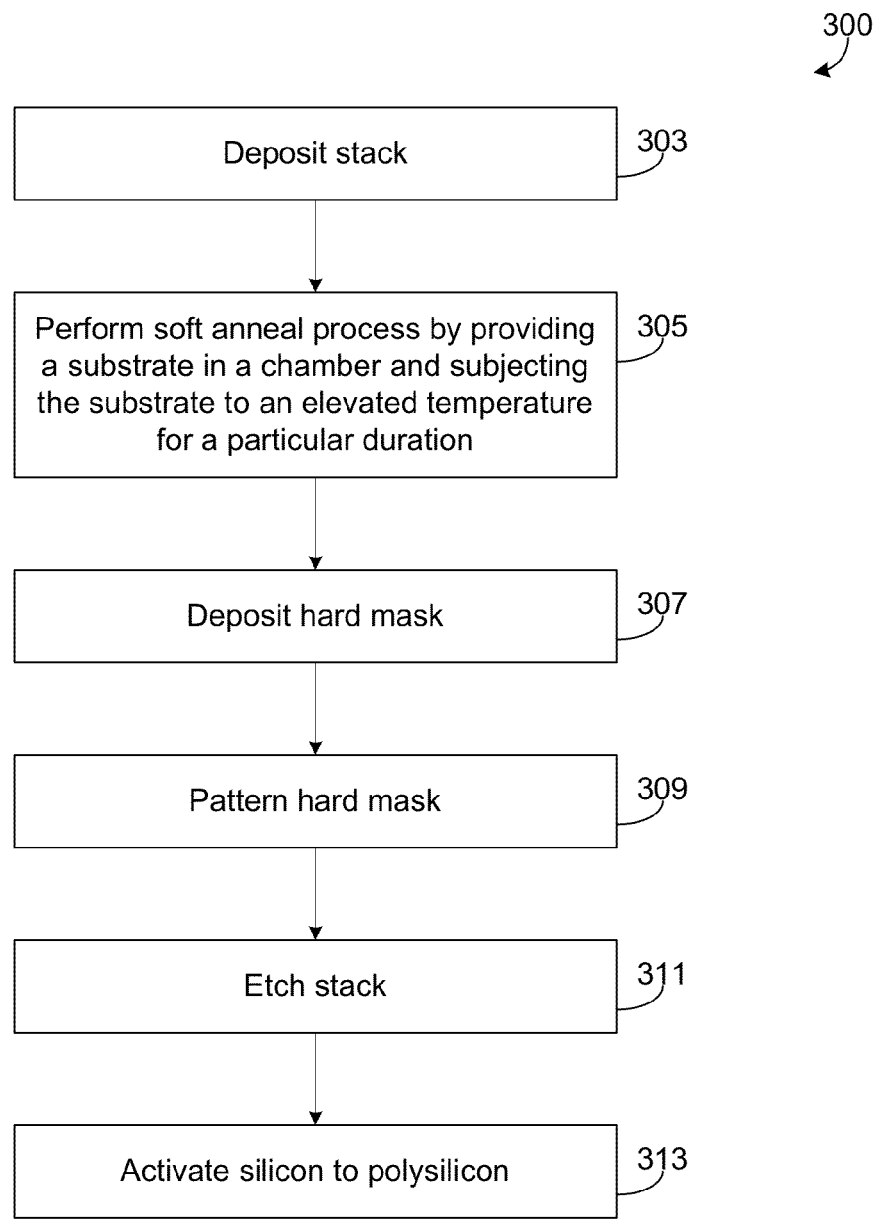
FIG. 3 shows a flowchart of a method of processing a semiconductor substrate in accordance with an embodiment disclosed herein.

FIG. 3 shows a flowchart of an embodiment in accordance with the methods described herein. Method 300 begins at block 303 where a stack is deposited on a substrate. As described herein, the stack typically includes alternating layers of material. In one embodiment, the alternating layers are doped and undoped silicon. In another embodiment, the alternating layers are doped silicon and dielectric material. Other types of layers may also be used. In certain embodiments, each of the layers is deposited by a chemical vapor deposition process such as a plasma enhanced chemical vapor deposition process. At block 305, a soft anneal process is performed. This process is achieved by providing a stack-coated substrate in an anneal chamber and subjecting the substrate to an elevated temperature for a particular duration. Examples of relevant time and temperature combinations are described above. Importantly, in many implementations, the soft anneal temperature should be below the temperature at which silicon transitions to polysilicon. This is especially important where the soft anneal process takes place before the etching operation, as the etching operation is most successful (i.e., etch selectivity is greatest between the two materials) when performed on unactivated silicon. At block 307, a hard mask is deposited on the stack. The mask may be an ashable hard mask in certain embodiments. At block 309, the hard mask is patterned. This patterning may be achieved through photolithographic techniques. At block 311, the patterned stack is etched to selectively remove (partially or wholly) one of the materials in the stack. A wet etch is often used for this purpose. Examples of suitable wet etching compositions are described elsewhere herein. The as-deposited silicon may then be activated to form polysilicon at block 313. The foregoing method is exemplary and is not intended to be limiting. The method does not need to be performed in the order listed in FIG. 3.

In fact, the soft anneal may be performed at any stage in fabrication after deposition of one or more silicon layers in a stack, but prior to activation of the as-deposited silicon to produce polysilicon. Some example steps that may occur between deposition and activation of the silicon include deposition of an ashable hard mask layer and/or etch stop layer, patterning the mask, etching the mask, and etching to selectively remove undoped silicon and/or other material from the stack. One or more of these processes may be absent in a given embodiment, or may occur in an order that is different from the order explicitly described. Although the soft anneal process may be performed at any time after stack deposition and before activation, it is particularly beneficial to perform the process before any patterning takes place. If the bow of a substrate is substantial, lithographic patterning will not be as successful. These techniques require precise focusing, and this focusing is compromised when a substrate is not shaped as it should be (i.e., when it is not flat).

The stack may have a composition and arrangement as described above (i.e., it may include layers of doped polysilicon with alternating layers of one or more other materials). In some embodiments, those other materials are a dielectric (e.g., a silicon oxide or a variant thereof such as an oxicarbide or an oxinitride), undoped silicon, and the like. In some cases, the alternating layers are deposited in a single vacuum controlled apparatus with multiple stations or variable process conditions to effect deposition of the layers of different compositions. In certain embodiments, the layers of the stack are deposited by a PECVD process.

The reduction in wafer bow by soft annealing as described herein can be achieved without delaminating, peeling or blistering. Blistering is often evidenced by small bubbles or divots where material popped out of the stack. Peeling involves separation between layers at an intermediate position in the stack, i.e., between two different layers of the stack. Delamination results when the entire stack separates from the substrate.

Further, the stack bow can be modulated or tuned simply by controlling the conditions of the soft anneal. In some embodiments, it is desirable to produce some degree of wafer bow after the soft anneal. In other embodiments, it is desirable to produce a wafer that is substantially flat (e.g., a bow of about 35 µm or less). Either result can be achieved by tuning the soft anneal conditions. Tuning may entail fine (or coarse or moderate) adjustments to a baseline temperature or duration of the soft anneal.

Apparatus

The methods described herein may be performed by any suitable apparatus. A suitable apparatus includes hardware for accomplishing the process operations and a system controller having instructions for controlling process operations in accordance with the present embodiments.

In some embodiments, the soft anneal apparatus is integrated with an apparatus for depositing a stack containing layers of doped silicon and layers of at least one other material such as silicon oxide (or other dielectric) or undoped silicon. Such deposition apparatus may include hardware for accomplishing the deposition operations and its own system controller having instructions for controlling deposition operations. In some embodiments, the deposition apparatus is a PECVD apparatus.

Figure 4:
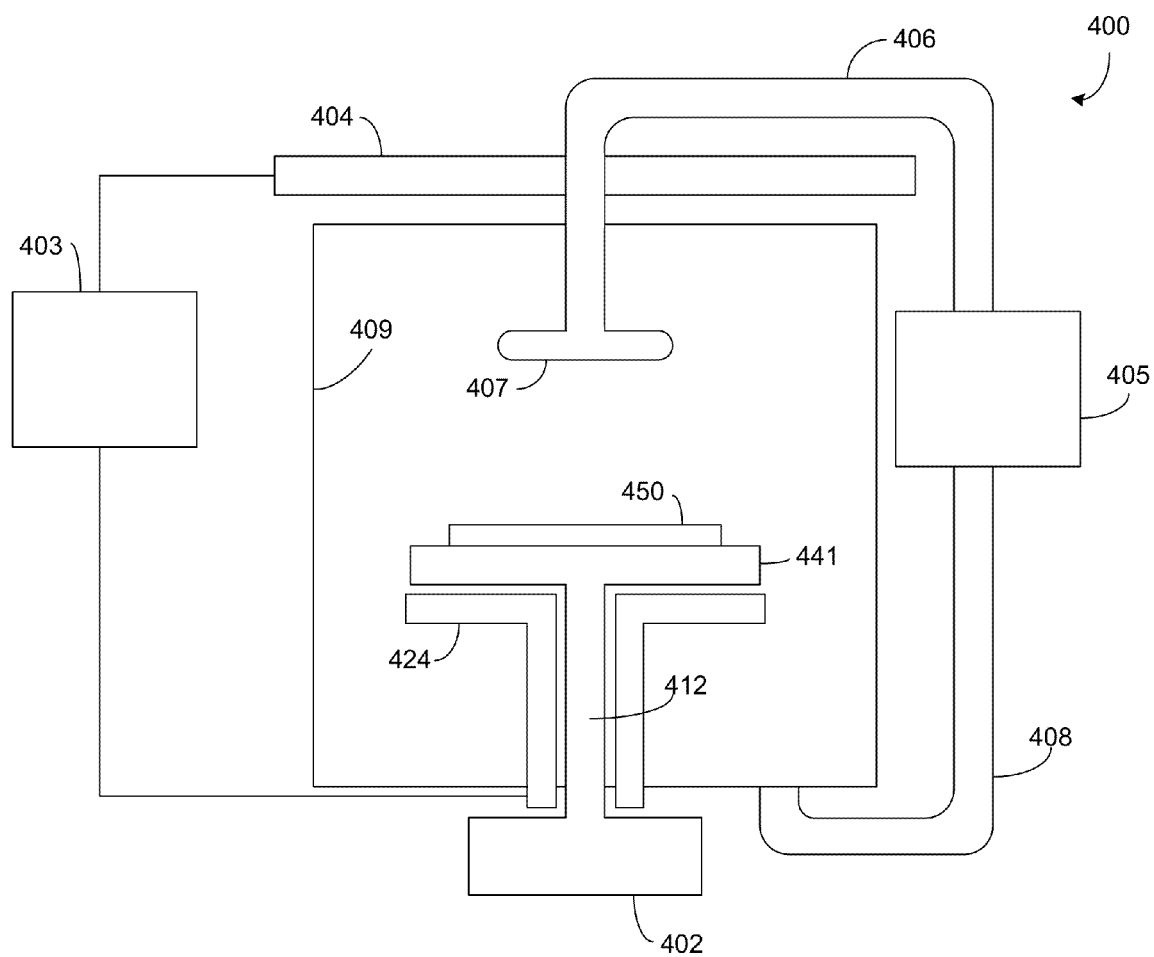
FIG. 4 shows an example of an annealing chamber that may be used in accordance with the embodiments herein.

FIG. 4 shows a simplified depiction of a suitable soft anneal chamber 400 in accordance with an embodiment disclosed herein. Wafer 450 is mounted on a susceptor 441 supported by susceptor support 412. A susceptor position control 402 may rotate the wafer 450 during processing, and may also raise and lower susceptor 441 to certain positions in order to load, unload or process a wafer 450. Heat control mechanism 403 controls heat sources 404 and 424, which heats the wafer 450 to a substantially uniform temperature during processing. Gas flow control 405 regulates the flow of gases into the reaction chamber 409 of the anneal chamber 400. This control may be achieved by controlling the flow of gas in inlet channel 406 and gas injection head 407, as well as exhaust gases from the reaction chamber 409 through outlet channel 408. In another embodiment of the soft anneal chamber (not shown), gases are introduced into the reaction chamber through a plurality of side jets. In yet other embodiments of the soft anneal apparatus, the reaction chamber may be shaped in a non-rectangular fashion (e.g., bell shaped, rounded, etc.). Any chamber shape may be used.

The anneal can be conducted in any vehicle that permits delivery of energy to the silicon layers under conditions allowing adequate temperature control. One example of such a vehicle is a furnace that includes conventional heating elements such as resistive heating elements. In some embodiments, the anneal is conducted in a chamber that employs radiation from one or more lamps or laser sources to provide annealing energy. Rapid thermal annealing (RTA) chambers are a widely used type of lamp source annealing chamber that can be used to perform the soft anneal described herein. One example of a suitable RTA tool is the Applied Materials Vantage Radiance Plus RTP. In some examples, the RTA tool has multiple bulbs, all positioned above the wafer. The temperature is monitored near the wafer bottom to ensure that the entire wafer (not just the wafer surface) is adequately heated through. This is opposed to a laser anneal, which locally heats the surface of the wafer. In some embodiments, the wafer rotates on a platen during RTA. RTA tools and methods are further discussed and described in U.S. Pat. No. 6,151,447, filed on Nov. 25, 1997, which is incorporated by reference herein.

Figure 5:
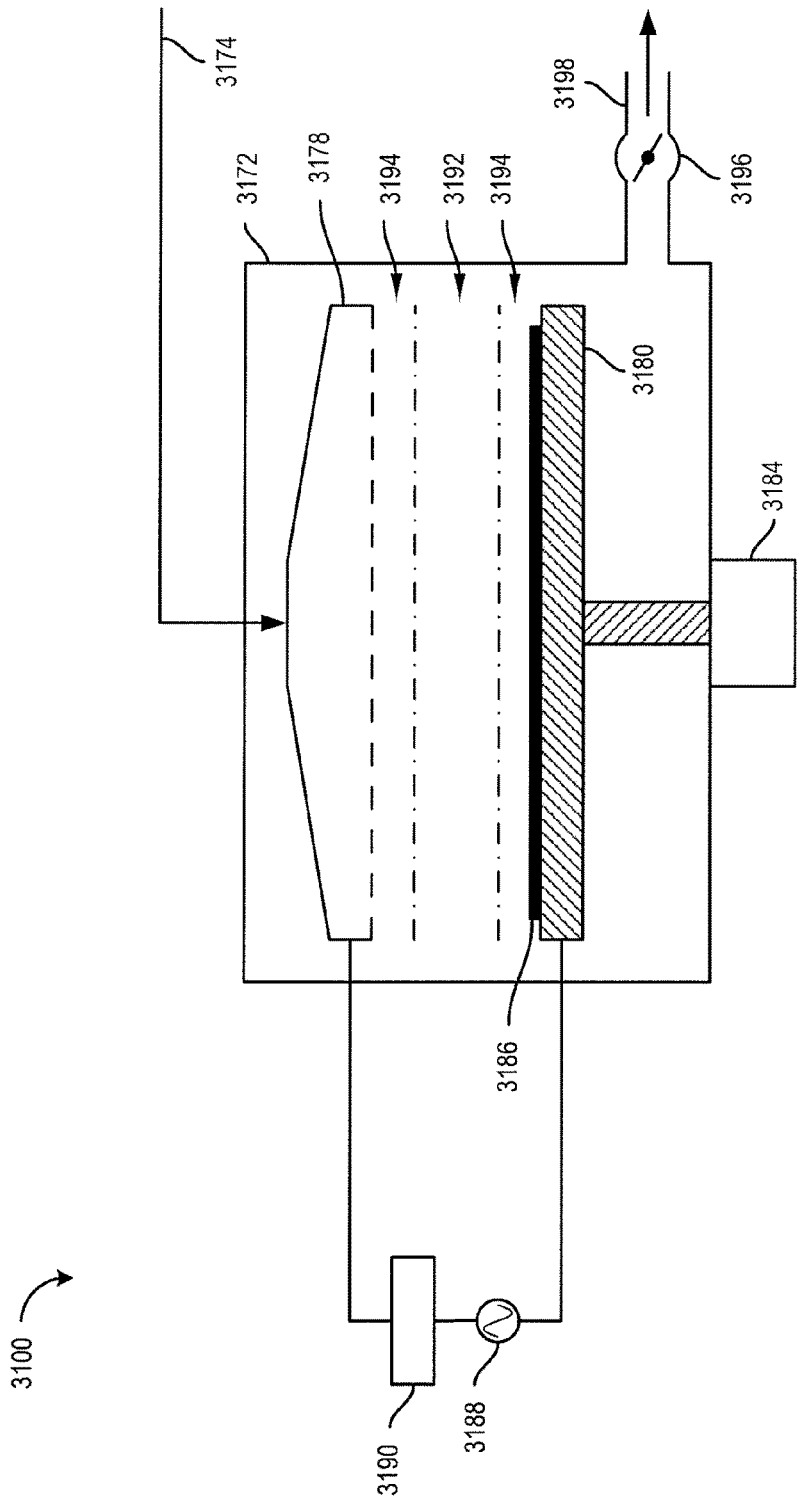
FIG. 5 depicts an example of a PECVD deposition processing station that may be used in accordance with an embodiment herein.

FIG. 5 schematically shows a deposition process station 3100 in accordance with the embodiments herein. For simplicity, process station 3100 is depicted as a standalone process station having a process chamber body 3172 for maintaining a low-pressure environment. However, it will be appreciated that a plurality of process stations 3100 may be included in a common low-pressure process tool environment. Process station 3100 includes a process gas delivery line 3174 for providing process gases, such as inert gases, precursors, reactants, and treatment reactants, for delivery to process station 3100. In the example shown in FIG. 5, a showerhead 3178 is included to distribute process gases within process station 3100. Substrate 3186 is located beneath showerhead 3178, and is shown resting on a holder 3180 supported by a pedestal 3182. In some embodiments, pedestal 3182 may be configured to rotate about a vertical axis. Additionally or alternatively, pedestal 3182 may be configured to translate horizontally and/or vertically.

In some embodiments, showerhead 3178 may be a dual-plenum or multi-plenum showerhead having a plurality of sets of gas distribution holes. For example, a first set of gas distribution holes may receive gas from a first process gas delivery line and a second set of gas distribution holes may receive gas from a second process gas delivery line, etc. Such physical isolation of process gases may provide an approach to reducing the amount of small particles generated from reaction of incompatible process gases in process gas delivery plumbing upstream of showerhead 3178.

Showerhead 3178 and holder 3180 electrically communicate with RF power supply 3188 and matching network 3190 for powering a plasma 3192. Plasma 3192 may be contained by a plasma sheath 3194 located adjacent to showerhead 3178 and holder 3180. While FIG. 5 depicts a capacitively-coupled plasma, plasma 3192 may be generated by any suitable plasma source. In one non-limiting example, plasma 3192 may include a parallel plate plasma source.

In the embodiment shown in FIG. 5, RF power supply 3188 may provide RF power of any suitable frequency. In some embodiments, RF power supply 3188 may be configured to control high- and low-frequency RF power sources independently of one another. Example low-frequency RF powers may include, but are not limited to, frequencies between 200 kHz and 2000 kHz. Example high frequency RF powers may include, but are not limited to, frequencies between 13.56 MHz and 80 MHz. Likewise, RF power supply 3188 and matching network 3190 may be operated at any suitable power to form plasma 3192. Examples of suitable powers include, but are not limited to, powers between 250 W and 5000 W for a high-frequency plasma (assuming a four station reaction chamber) and powers between 0 W and 2500 W (assuming a four station reaction chamber) for a low-frequency plasma for a four-station multi-process tool including four 15-inch showerheads. RF power supply 3188 may be operated at any suitable duty cycle. Examples of suitable duty cycles include, but are not limited to, duty cycles of between 5% and 90%.

In some embodiments, holder 3180 may be temperature controlled via heater 3184. Further, in some embodiments, pressure control for process station 3100 may be provided by butterfly valve 3196 or by any other suitable pressure control device. As shown in FIG. 5, butterfly valve 3196 throttles a vacuum provided by a vacuum pump (not shown) fluidly coupled to process station exhaust line 3198. However, in some embodiments, pressure control of process station 3100 may also be adjusted by varying a flow rate of one or more gases introduced to process station 3100.

It will be appreciated that control of one or more process parameters may be provided locally (e.g., RF power may be controlled by a plasma controller communicating with RF power supply 3188, process station pressure may be controlled by a valve controller communicating with butterfly valve 3196 or with gas metering valves or flow controllers included coupled with process gas delivery line 3174, etc.) or under partial or total control provided by a system controller (described in more detail below) communicating with process station 3100 without departing from the scope of the present disclosure.

As described above, one or more process stations may be included in a multi-station processing tool. In some embodiments of a multi-station process tool, control and/or supply of various process inputs (e.g., process gases, plasma power, heater power, etc.) may be distributed from shared sources to a plurality of process stations included in the process tool. For example, in some embodiments, a shared plasma generator may supply plasma power to two or more process stations. In another example, a shared gas distribution manifold may supply process gases to two or more process stations.

Figure 6:
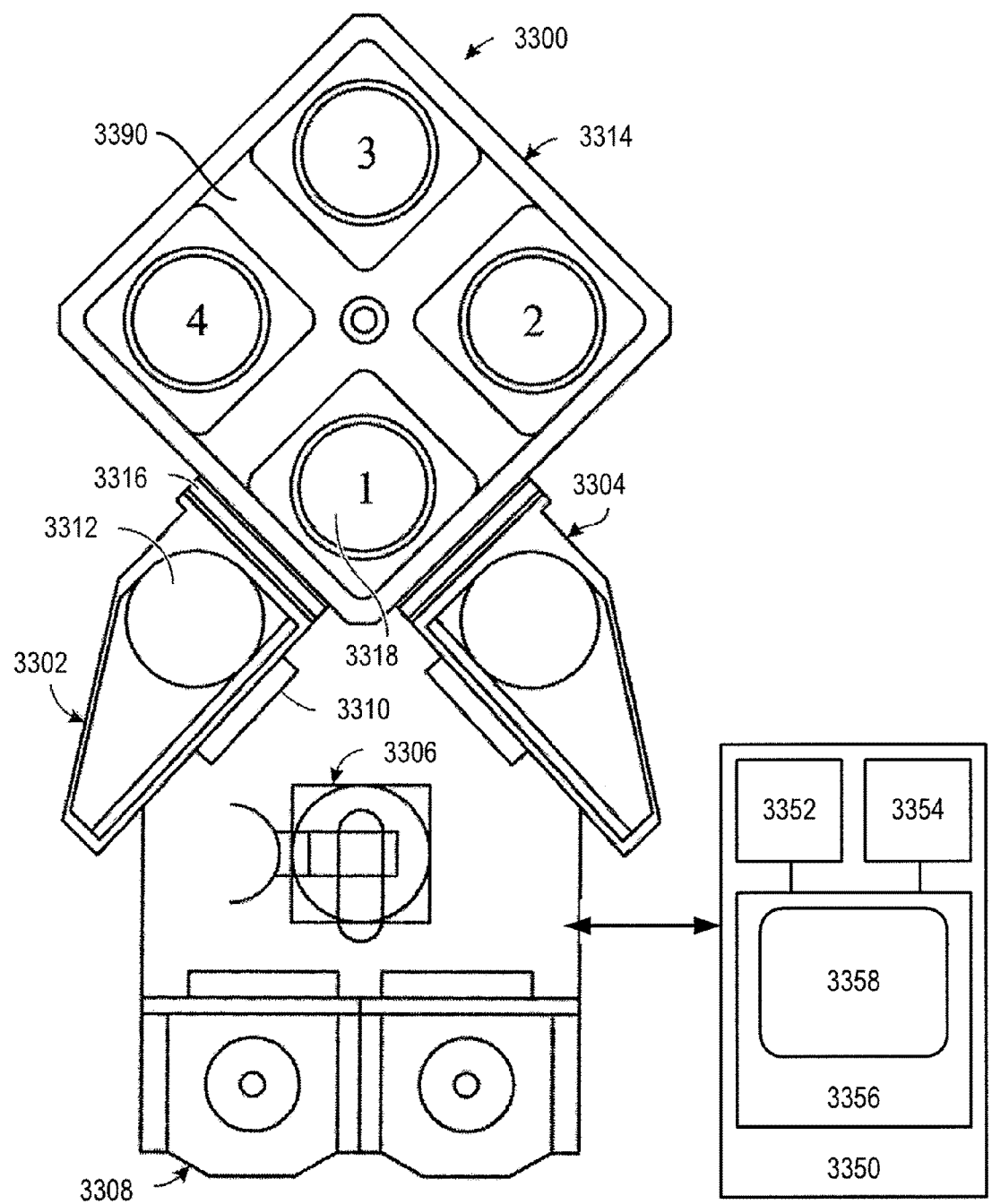
FIGS. 6-7 show multi-station semiconductor processing apparatuses in accordance with the embodiments herein.

FIG. 6 shows a schematic view of an embodiment of another multi-station processing tool 3300 with an inbound load lock 3302 and an outbound load lock 3304. A robot 3306, at atmospheric pressure, is configured to move substrates from a cassette loaded through a pod 3308 into inbound load lock 3302 via an atmospheric port 3310. Inbound load lock 3302 is coupled to a vacuum source (not shown) so that, when atmospheric port 3310 is closed, inbound load lock 3302 may be pumped down. Inbound load lock 3302 also includes a chamber transport port 3316 interfaced with processing chamber 3314. Thus, when chamber transport 3316 is opened, another robot (not shown) may move the substrate from inbound load lock 3302 to a pedestal of a first process station for processing.

In some embodiments, inbound load lock 3302 may be connected to a remote plasma source (not shown) configured to supply a plasma to load lock. This may provide remote plasma treatments to a substrate positioned in inbound load lock 3302. Additionally or alternatively, in some embodiments, inbound load lock 3302 may include a heater (not shown) configured to heat a substrate. This may remove moisture and gases adsorbed on a substrate positioned in inbound load lock 3302. While the embodiment depicted in FIG. 6 includes load locks, it will be appreciated that, in some embodiments, direct entry of a substrate into a process station may be provided.

The depicted processing chamber 3314 comprises four process stations, numbered from 1 to 4 in the embodiment shown in FIG. 6. In some embodiments, processing chamber 3314 may be configured to maintain a low pressure environment so that substrates may be transferred among the process stations without experiencing a vacuum break and/or air exposure. Each process station depicted in FIG. 6 includes a process station substrate holder (shown at 3318 for station 1) and process gas delivery line inlets. In some embodiments, one or more process station substrate holders 3318 may be heated.

In some embodiments, each process station may have different or multiple purposes. For example, a process station may be switchable between a soft anneal mode and a conventional anneal mode. Additionally or alternatively, in some embodiments, processing chamber 3314 may include one or more matched pairs of soft and conventional annealing stations. In another example, a process station may be switchable between two or more film types, so that stacks of different film types may be deposited in the same process chamber.

While the depicted processing chamber 3314 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 6 also depicts an embodiment of a substrate handling system 3390 for transferring substrates within processing chamber 3314. In some embodiments, substrate handling system 3390 may be configured to transfer substrates between various process stations and/or between a process station and a load lock. It will be appreciated that any suitable substrate handling system may be employed. Non-limiting examples include substrate carousels and substrate handling robots.

Figure 7:
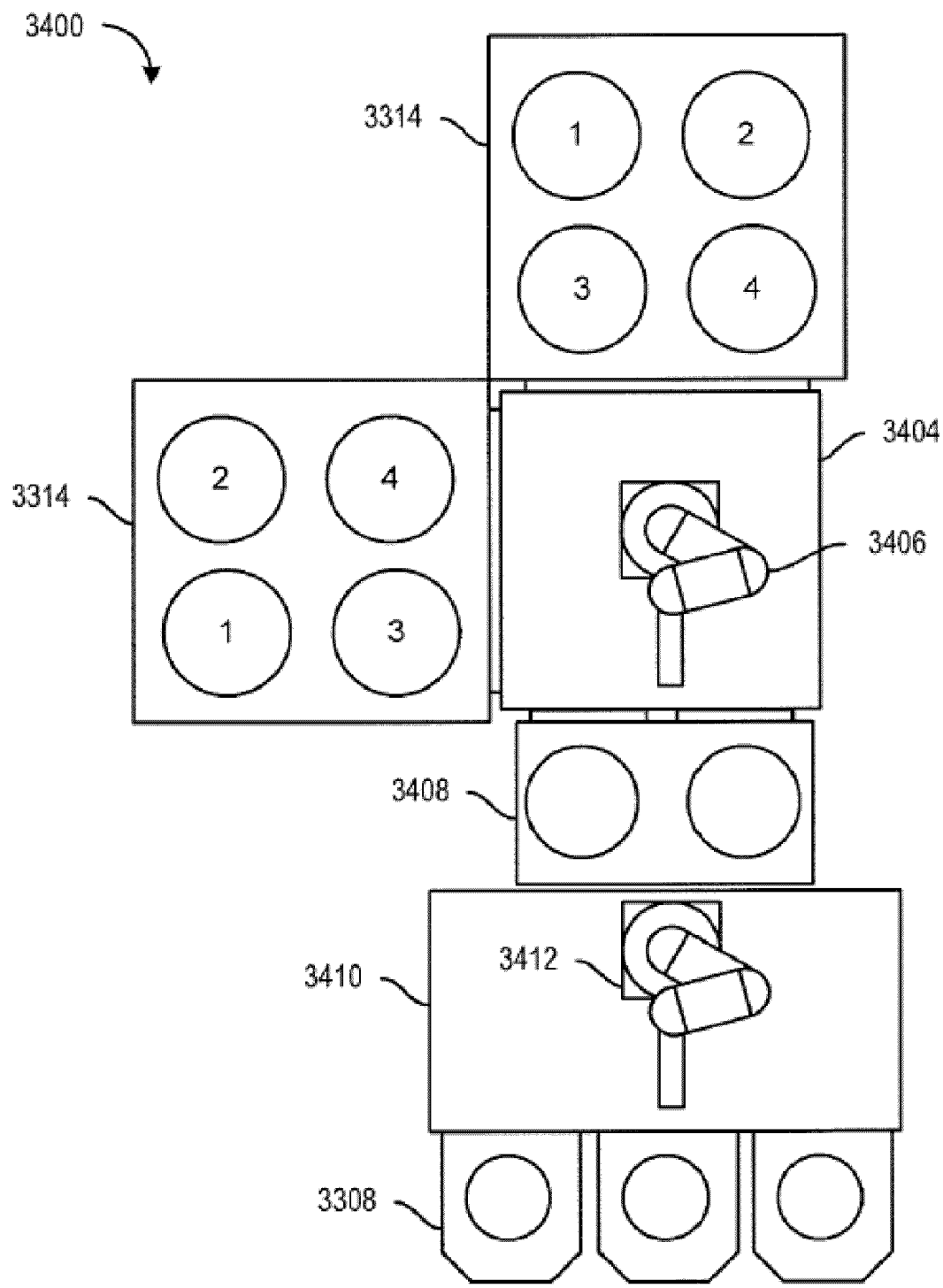

It will be appreciated that, in some embodiments, a low-pressure transfer chamber may be included in a multistation processing tool to facilitate transfer between a plurality of processing chambers. For example, FIG. 7 schematically shows another embodiment of a multi-station processing tool 3400. In the embodiment shown in FIG. 7, multi-station processing tool 3400 includes a plurality of processing chambers 3314 including a plurality of process stations (numbered 1 through 4). Processing chambers 3314 are interfaced with a low-pressure transport chamber 3404 including a robot 3406 configured to transport substrates between processing chambers 3314 and load lock 3408. An atmospheric substrate transfer module 3410, including an atmospheric robot 3412, is configured to facilitate transfer of substrates between load lock 3408 and pod 3308.

System Controller

Turning back to FIG. 6, multi-station processing tool 3300 also includes an embodiment of a system controller 3350 employed to control process conditions and hardware states of processing tool 3300. For example, in some embodiments, system controller 3350 may control one or more process parameters during a PECVD film deposition phase to achieve a desired wet etch rate of the deposited film. The system controller may additionally control one or more anneal stations for controlling soft and/or conventional anneal operations. While not shown in FIG. 7, it will be appreciated that the embodiment of multi-station processing tool 3400 may include a suitable system controller like the embodiment of system controller 3350 shown in FIG. 6.

In some embodiments, a system controller 3350 (which may include one or more physical or logical controllers) controls some or all of the operations of a process tool. Instructions for implementing appropriate control operations are executed on the processor. These instructions may be stored on the memory devices associated with the controller or they may be provided over a network. In certain embodiments, the system controller executes system control software.

For example, a controller may control the delivery of appropriate gases (e.g., nitrogen or inert gases), the receipt of a wafer from outside the apparatus and/or the transfer a wafer from one station to the next of a multi-station chamber. The controller may also control the temperature profile of a wafer during a soft anneal and the duration the soft anneal.

System controller 3350 may include one or more memory devices 3356, one or more mass storage devices 3354, and one or more processors 3352. Processor 3352 may include a CPU or computer, analog and/or digital input/output connections, stepper motor controller boards, etc.

In some embodiments, system controller 3350 controls all of the activities of processing tool 3300. In some embodiments, system controller 3350 executes machine-readable system control software 3358 stored in mass storage device 3354, loaded into memory device 3356, and executed on processor 3352 so that the apparatus will perform a method in accordance with the present embodiments. Alternatively, the control logic may be hard coded in the controller. Applications Specific Integrated Circuits, Programmable Logic Devices (e.g., FPGAs) and the like may be used for these purposes. In the following discussion, wherever "software" or "code" is used, functionally comparable hard coded logic may be used in its place.

System control software 3358 may include instructions for controlling the timing, mixture of gases, chamber and/or station pressure, chamber and/or station temperature, substrate temperature, target power levels, RF power levels, substrate pedestal, chuck and/or susceptor position, and other parameters of a particular process performed by processing tool 3300. System control software 3358 may be configured in any suitable way. For example, various process tool component subroutines or control objects may be written to control operation of the process tool components for performing various process tool processes. System control software 3358 may be coded in any suitable computer readable programming language.

In some embodiments, system control software 3358 may include input/output control (IOC) sequencing instructions for controlling the various parameters described above. For example, each phase of a fabrication process may include one or more instructions for execution by system controller 3350. The instructions for setting process conditions for a soft anneal process phase, for example, may be included in a corresponding soft anneal recipe phase. In some embodiments, the soft anneal phases may be sequentially arranged, so that all instructions for a soft anneal phase are executed concurrently with that process phase.

Other computer software and/or programs stored on mass storage device 3354 and/or memory device 3356 associated with system controller 3350 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto process station substrate holder 3318 and to control the spacing between the substrate and other parts of processing tool 3300.

A process gas control program may include code for controlling gas composition and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to one or more heating units that are used to heat the substrate and/or processing chamber. Alternatively, the heater control program may control delivery of a heat transfer gas (such as helium) to the substrate.

A plasma control program may include code for setting RF power levels applied to the process electrodes in one or more process stations.

In some embodiments, there may be a user interface associated with system controller 3350. The user interface may include a display screen, graphical software displays of the apparatus and/or process conditions, and user input devices such as pointing devices, keyboards, touch screens, microphones, etc.

In some embodiments, parameters adjusted by system controller 3350 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 3350 from various process tool sensors. The signals for controlling the process may be output on the analog and digital output connections of processing tool 3300. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 3350 may provide program instructions for implementing the above-described deposition processes. The program instructions may control a variety of process parameters, such as DC power level, RF bias power level, pressure, temperature, duration of exposure to processing gases and/or heat and/or other energy sources, etc. The instructions may control the parameters to operate in-situ deposition and further processing (e.g., soft annealing, patterning, etching, and activating) of film stacks according to various embodiments described herein.

Applications

Many types of device can be fabricated using stacks prepared as described herein. In various embodiments, the stacks have at least about 10 layers, or 5 pairs of layers. As mentioned, the layer pairs can contain a dielectric layer and a silicon layer, an undoped silicon layer and a doped silicon layer, etc. In some embodiments, a device stack includes at least about 10 pairs of layers, or at least about 15 pairs of layers, or at least about 20 pairs of layers, or at least about 25 pairs of layers. In some embodiments, the stack is employed in a memory device such as a vertically oriented memory device.

Figure 12A:
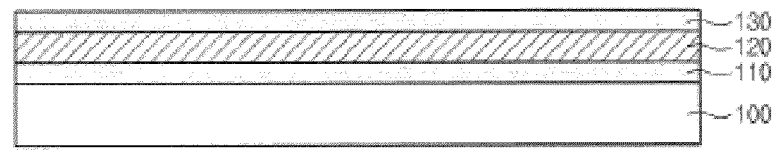
FIGS. 12A-12P show cross-sectional views illustrating a method for fabricating a nonvolatile memory device in accordance with a method disclosed herein.
Figure 12B:
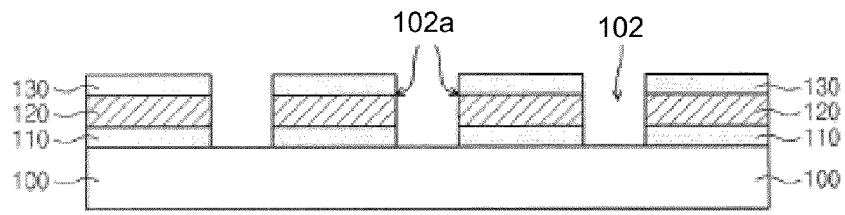
Figure 12C:
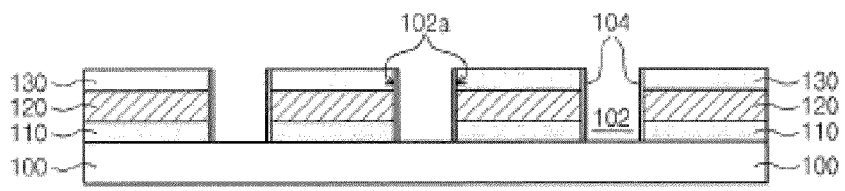
Figure 12D:
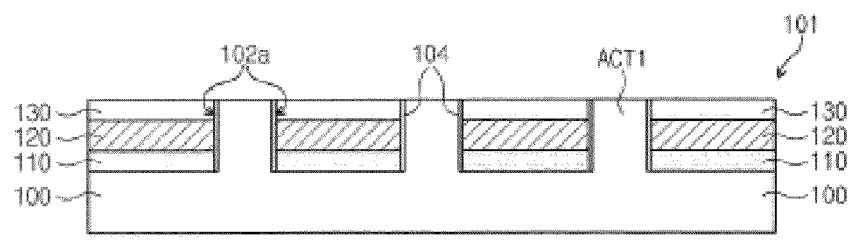
Figure 12E:
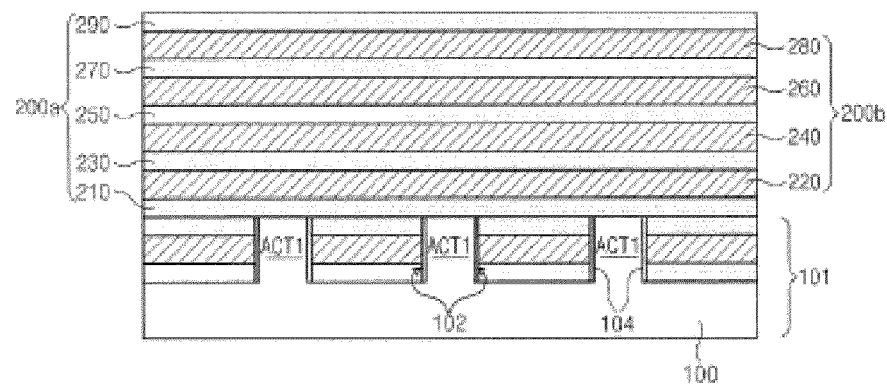
Figure 12F:
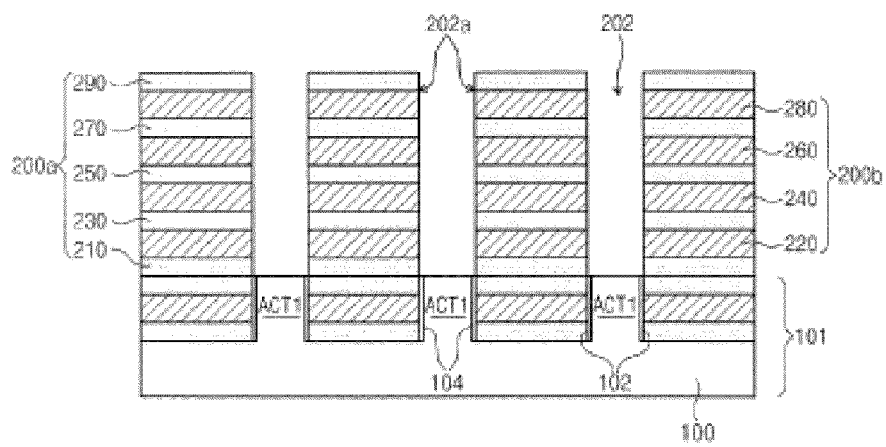
Figure 12G:
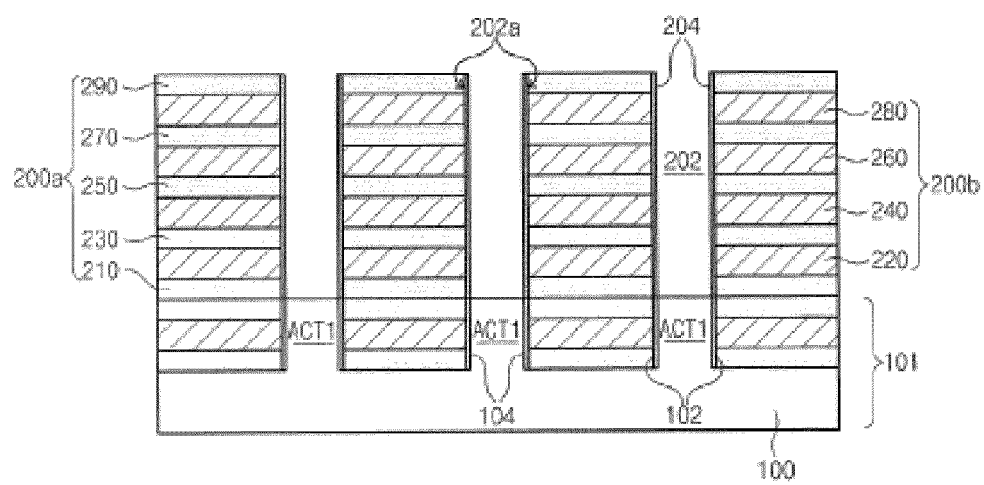
Figure 12H:
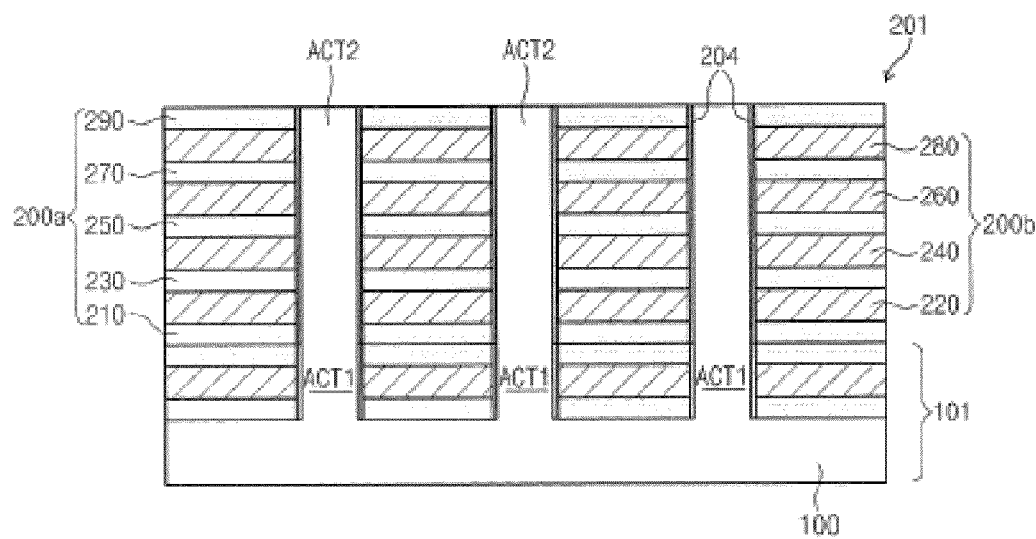
Figure 12I:
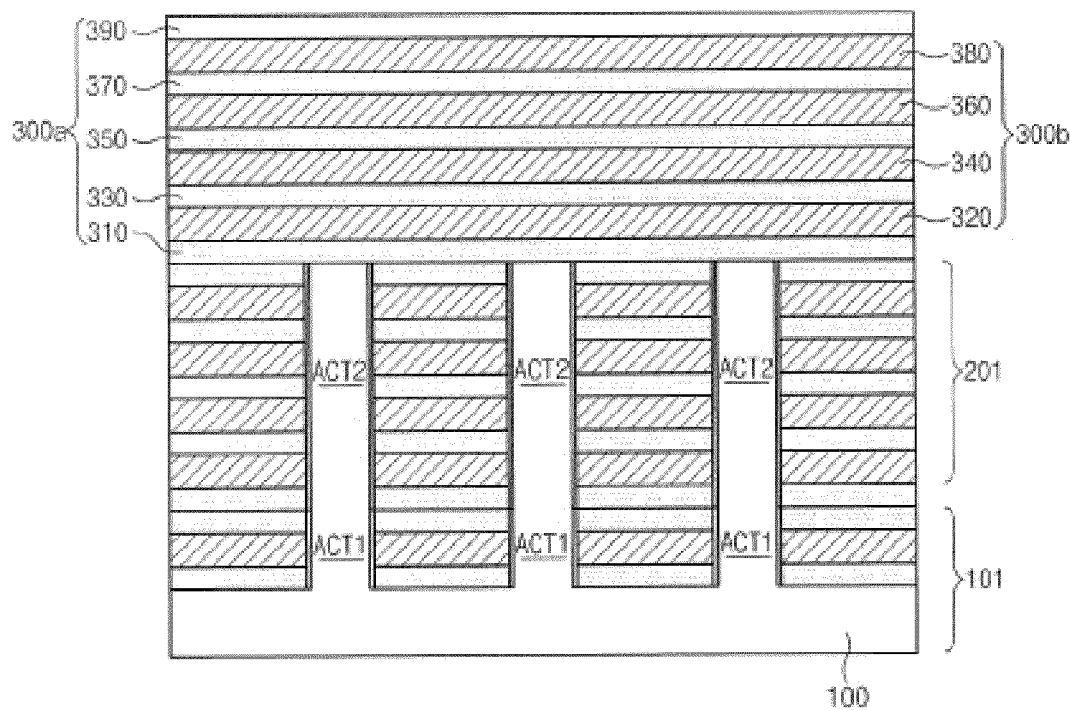
Figure 12J:
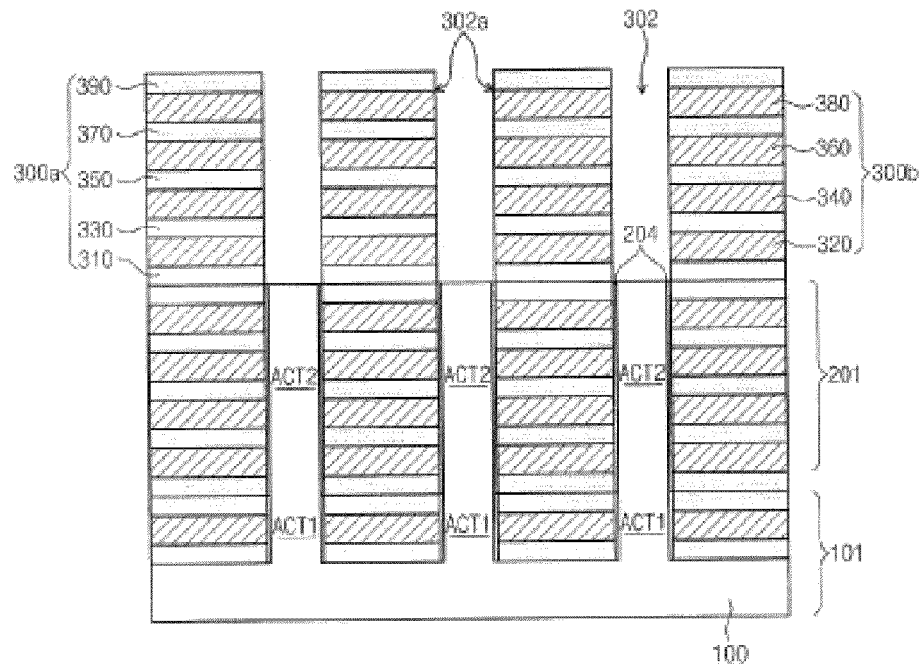
Figure 12K:
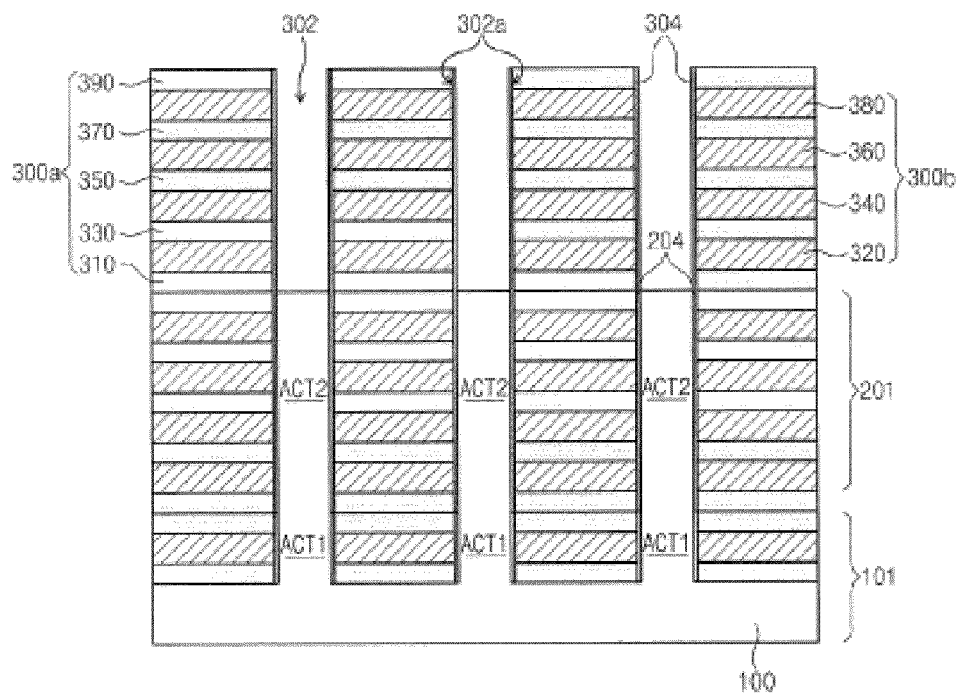
Figure 12L:
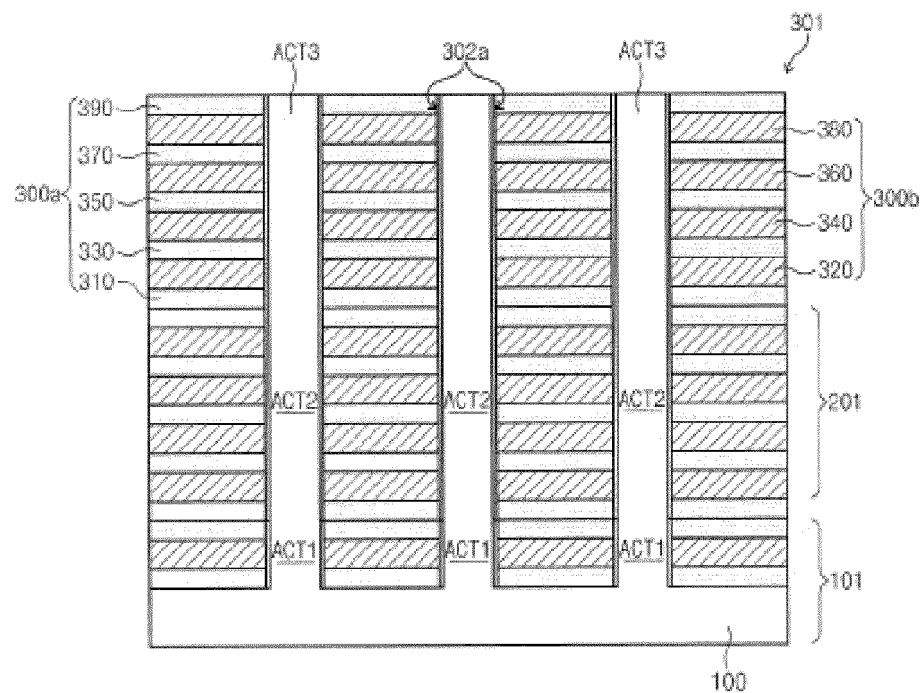
Figure 12M:
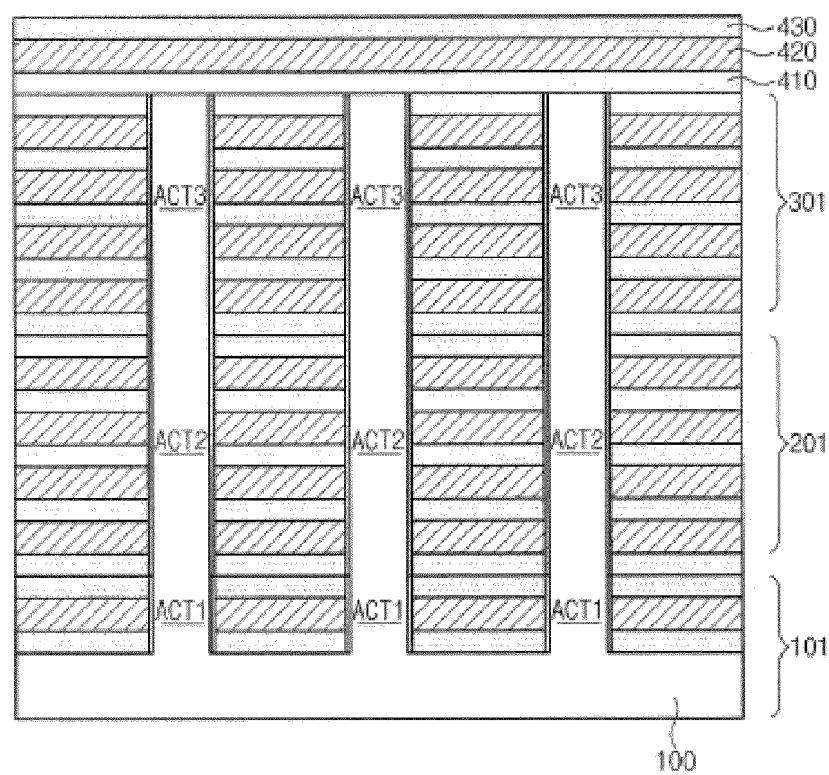
Figure 12N:
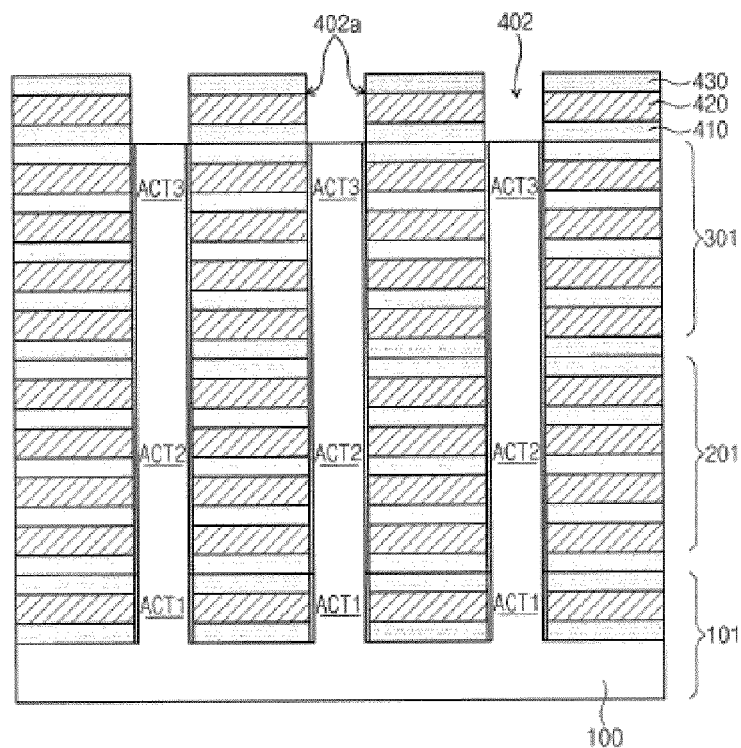
Figure 12O:
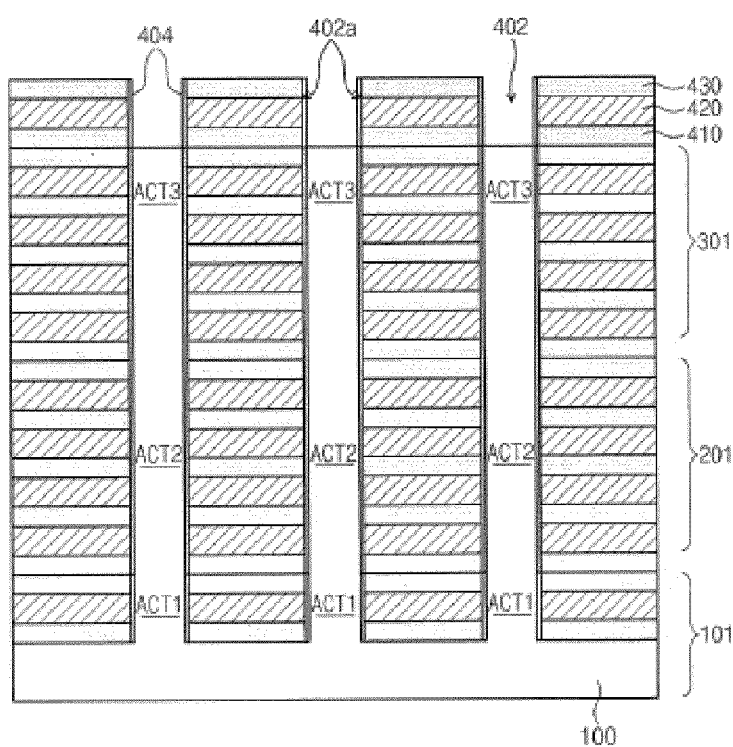
Figure 12P:
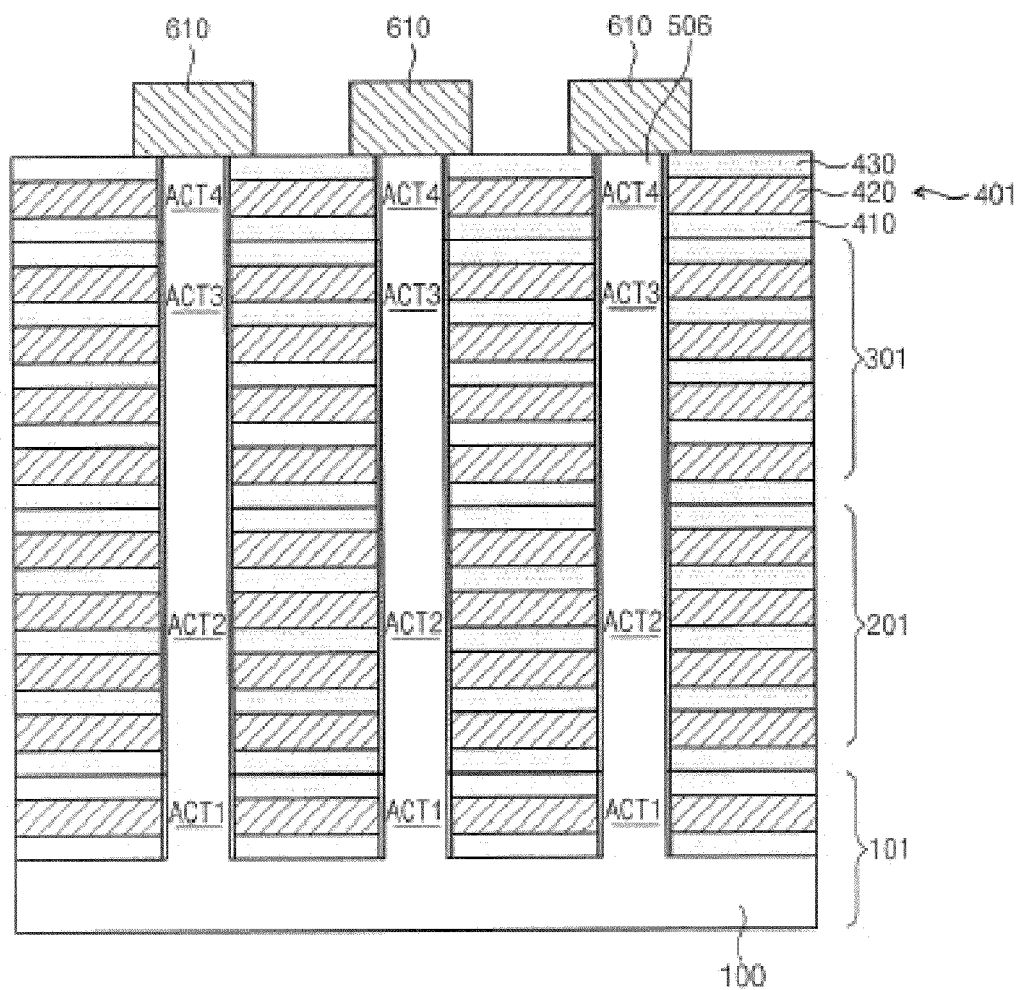

FIGS. 12A-12P depict fabrication of a memory device as disclosed herein using an exemplary set of steps. The steps depicted in FIGS. 12A-P in no way limit the way in which a memory device as disclosed herein can be fabricated. It should also be noted that the figures are not necessarily to scale and do not necessarily depict the article at every state of preparation, i.e. intermediate stages of the article may not be illustrated in the sequence of figures. Further, the reference numbers used in FIGS. 12A-12P do not correspond to reference numbers in other figures, despite any overlap. The materials and processes discussed with respect to FIGS. 12A-P also in no way limit materials or processes that can be utilized herein. This fabrication process is further discussed and described in U.S. patent application Ser. No. 12/612,125, filed Nov. 4, 2009, which is herein incorporated by reference in its entirety.

FIGS. 12A through 12P are cross-sectional views illustrating a method for manufacturing a nonvolatile memory device according to an embodiment of the present invention. Referring to FIG. 12A, an insulating layer 110, a conductive layer 120 and an insulating layer 130 are sequentially formed on a semiconductor substrate 100. The semiconductor substrate 100 may be doped with dopants of first conductivity type, for example, P-type dopants. The semiconductor substrate 100 may have a region having a different conductive type, i.e., a well region. The well region may be formed in a pocket well or a triple well structure. The insulating layers 110 and 130 may be formed by depositing an insulating material such as silicon oxide, silicon nitride, silicon oxynitride or the like. The conductive layer 120 may be used as a lower select gate. The conductive layer 120 (hereinafter, referred to as the "lower select gate") may be formed by depositing a conductive material, such as doped polycrystalline silicon or metal so that the conductive layer 120 can be used as a gate.

Referring to FIG. 12B, at least one opening 102 exposing the semiconductor substrate 100 is formed, by using, for example, a photolithography and etching process. The first opening 102 may have, for example, a circular or polygonal (e.g., rectangular) cross section. The first opening 102 is filled with silicon as will be described later, to form an active bar used as a channel of a transistor. If sidewalls 102a of the first opening 102 are formed inclined at a predetermined angle, the size of the active bar is varied with its height, so that the channel width of the transistor may not be uniform. Non-uniform channel width may act as a hindrance factor in realizing uniform electrical characteristics of a semiconductor memory device. Therefore, in some embodiments, the first opening 102 may be formed by using an anisotropic etching technique, for example, a dry etching technique such that the first opening 102 has the sidewalls 102a that are vertical to the-surface of the semiconductor substrate 100.

Referring to FIG. 12C, an insulating layer 104 is formed on the sidewalls 102a of the first opening 102. The insulating layer 104 may be used as a gate dielectric (hereinafter, referred to as a "first gate dielectric portion") of the lower select gate 120. In one example, the first gate dielectric portion 104 may be formed by depositing silicon oxide. In the deposition process for forming the first gate dielectric portion 104, silicon oxide may be deposited on the semiconductor substrate 100 that is exposed by the first opening 102. The silicon oxide deposited on the semiconductor substrate 100 may be removed by using an etching technique so that the semiconductor substrate 100 and an active bar to be described later are electrically connected to each other. A spacer for protecting the silicon oxide layer that is deposited on the sidewalls 102a of the first opening 102 from the etching may also be formed prior to the above-mentioned etching step.

Referring to FIG. 12D, a first active bar ACT1 is deposited in the first opening 102. The first active bar ACT1 may substantially fill the first opening 102. The first active bar ACT1 may be formed of the same material as the semiconductor substrate 100. In one example, the first active bar ACT1 may be formed by depositing a silicon layer and planarizing the deposited silicon layer through a chemical mechanical polishing (CMP) process. The silicon layer for forming the first active bar ACT1 may be formed by depositing polycrystalline silicon or amorphous silicon. In other embodiments, the first active bar ACT1 may be epitaxially grown from the portion of the semiconductor substrate 100 that is exposed by the first opening 102. In this case, the semiconductor substrate 100 and the first active bar ACT1 may be a single crystalline silicon which is continuous without crystalline defects. The first active bar ACT may be doped with the same conductivity type dopants as the semiconductor substrate 100. In some embodiments, the semiconductor substrate 100 and the first active bar ACT1 may have a P-type conductivity. Alternatively, the first active bar ACT1 may be not doped with dopants.

Through the foregoing processes, a first structure 101 including the semiconductor substrate 100, the lower select gate 120 above the semiconductor substrate 100, and the first active bar ACT1 used as a channel of the lower select gate 120 may be manufactured.

Referring to FIG. 12E, a first insulating layer group 200a and a first conductive layer group 200b are formed on the first structure 101. The first insulating layer group 200a may include a plurality of insulating layers 210, 230, 250, 270, 290. The first conductive layer group 200b may include a plurality of conductive layers 220, 240, 260, 280. The plurality of conductive layers 220, 240, 260, 280 and the plurality of insulating layers 210, 230, 250, 270, 290 may be alternatingly disposed to form a stacked sandwich structure. The insulating layer 210 may be positioned at the bottom of the stacked structure directly on the first structure 101, and the insulating layer 290 may be positioned at the top of the stacked structure to cover the conductive layer 280. Each of the plurality of conductive layers 220, 240, 260, 280 of the first conductive layer group 200b may be used as a cell gate pattern. The plurality of conductive layers 220, 240, 260, 280 may be formed by depositing doped polycrystalline silicon or metal. As used herein, the term "the first conductive layer group" 200b may be interchanged with the term "first cell gate pattern group", and the term "each of the plurality of conductive layers" 220, 240, 260, 280 may be interchanged with the term "first cell gate pattern."

Each of the plurality of conductive layers 220, 240, 260, 280 may have substantially the same thickness. Since thickness and/or interval of each of the plurality of conductive layers 220, 240, 260, 280 may determine a channel length, the thickness and/or interval of each of the plurality of conductive layers 220, 240, 260, 280 may be selected in a range that can solve limitations in the electrical characteristics due to a short channel. Also, since the plurality of conductive layers 220, 240, 260, 280 can be formed by deposition, the channel length can be controlled precisely.

The plurality of insulating layers 210, 230, 250, 270, 290 may be formed by depositing silicon oxide, for example. In further embodiments, the plurality of insulating layers 210, 230, 250, 270, 290 may be formed of high-k dielectric. In still further embodiments, each of the plurality of insulating layers 210, 230, 250, 270, 290 may be formed by depositing a material (e.g., silicon nitride, silicon oxynitride) having a dielectric constant higher than silicon oxide.

The number, thickness, material and the like of layers constituting the first insulating layer group 200a and the first conductive layer group 200b may be modified in various forms with consideration of electrical characteristics of a memory transistor and technical difficulties in the process of patterning these layers. Each of the first insulating layer group 200a and the first conductive layer group 200b may be formed in a step form.

Referring to FIG. 12F, the first insulating layer group 200a and the conductive layer group 200b are patterned via a photolithography and etching process to form a second opening 202 that exposes the first active bar ACT1. The first gate dielectric portion 104 may be exposed by the second opening 202. The second opening 202 may be formed by using, for example, a dry etching so as to have vertical sidewalls 202a and thus realize uniform electrical characteristics for a transistor. The first opening 102 and the second opening 202 can be connected in a vertical direction.

The number of the plurality of conductive layers 220, 240, 260, 280 constituting the first conductive layer group 200b and the number of the plurality of insulating layers 210, 230, 250, 270, 290 constituting the first insulating layer group 200a may be varied from the four conductive layer and five insulating layer embodiment depicted in the figures. In this embodiment, while the number of conductive layers 220, 240, 260, 280 constituting the first conductive layer group 200b is set at 4 layers and the number of insulating layers 210, 230, 250, 270, 290 constituting the first insulating layer group 200a is set at 5 layers, these numbers are arbitrary.

Referring to FIG. 12G, an insulating layer 204 is formed on the sidewalls 202a of the second opening 202. The insulating layer 204 may be used as a gate dielectric (hereinafter, referred to as the "second gate dielectric portion") of a first cell gate pattern group 200b. The second gate dielectric portion 204 may include a data storage layer. In one example, the second gate dielectric portion 204 may be formed in a triple layer structure by sequentially depositing a silicon oxide layer, a silicon nitride layer or a silicon oxynitride layer, and a silicon oxide layer or the like. In the second gate dielectric portion 204, the silicon nitride layer or the silicon oxynitride layer is used as a charge storage layer for trapping a charge and storing information, and any one of the two silicon oxide layers is used as a blocking barrier and the other is used as a tunnel barrier.

The second gate dielectric portion 204 may be formed on the first active bar ACT1 that is exposed by the second opening 202. The second gate dielectric portion 204 that is deposited on the first active bar ACT1 during the deposition process may be removed by using an etching technique so that the first active bar ACT1 and a second active bar ACT2 may be electrically connected to each other. Prior to this etching process, a spacer for protecting the second gate dielectric portion 204 that is deposited on the sidewalls 202a of the second opening 202 from the etching may be formed.

Referring to FIG. 12H, a second active bar ACT2 is formed in the second opening 202 by using a process that is the same as or similar to that described with reference to FIG. 12D. The second active bar ACT2 may be connected to the first active bar ACT1 in a vertical direction, and may also be connected to the surface of the semiconductor substrate 100. The second active bar ACT2 may be formed of the same material as the first active bar ACT1. In some embodiments, the second active bar ACT2 may be formed by depositing amorphous or polycrystalline silicon and planarizing the deposited amorphous or polycrystalline silicon layer through a chemical mechanical polishing (CMP) process. In other embodiments, the second active bar ACT2 may be formed by epitaxially growing single crystalline silicon from the first active bar ACT1. The second active bar ACT2 may be formed to have the same conductivity type as the semiconductor substrate 100 and the first active bar ACT1, for example, P-type conductivity. Alternatively, the semiconductor substrate 100 and the first and second active bars ACT1 and ACT2 may not be doped with dopants.

Through the foregoing processes, a second structure 201 including the plurality of cell gate patterns 220, 240, 260, 280 on the first structure 101, and the second active bar ACT2 that is used as a channel of the plurality of cell gate patterns 220, 240, 260, 280 can be formed.

Referring to FIG. 12I, a second insulating layer group 300a that includes a plurality of insulating layers 310, 330, 350, 370, 390 and a second conductive layer group 300b that includes a plurality of conductive layers 320, 340, 360, 380 which are alternatingly disposed with the plurality of insulating layers 310, 330, 350, 370, 390 are formed in a stacked sandwich structure by using a process that is the same as or similar to that described with reference to FIG. 12E. The insulating layer 310 is disposed at the bottom of the stack, directly on the second structure 201, and the insulating layer 390 is at the top of the stack and covers the conductive layer 380. Each of the plurality of conductive layers 320, 340, 360, 380 of the second conductive layer group 300b may be used as a cell gate pattern. For this purpose, the plurality of conductive layers 320, 340, 360, 380 may be formed by depositing doped polycrystalline silicon or metal. The plurality of conductive layers 320, 340, 360, 380 may each have substantially the same thickness. In this specification, the term "second conductive layer group 300b" may be exchanged with the term "second cell gate pattern", and the term "each of the plurality of conductive layers" 320, 340, 360, 380 may be exchanged with the term in "second cell gate pattern." The plurality of insulating layers 310, 330, 350, 370, 390 may be formed by depositing silicon nitride or silicon oxynitride having a dielectric constant higher than silicon oxide. Each of the second insulating layer group 300a and the second conductive layer group 300b may be formed in a step form.

Referring to FIG. 12J, the second insulating layer group 300a and the second conductive layer group 300b are patterned using a process that is the same as or similar to that described with reference to FIG. 12F to form a third opening 302 that exposes the second active bar ACT2. The second gate dielectric portion 204 may be exposed by the third opening 302. The third opening 302 may be formed using, for example, a dry etching process so as to provide an opening having vertical sidewalls 302 and to thus realize uniform electrical characteristics for the transistors. The second opening 202 and the third opening 302 may be connected in a vertical direction. Although the third opening 302 is formed inclined with a predetermined angle, the number of conductive layers 320, 340, 360, 380 constituting the second conductive layer group 300b and the number of insulating layers 310, 330, 350, 370, 390 constituting the second insulating layer group 300a may be selected such that a third active bar can be formed at a height that can neglect an increasing degree of cell dispersion.

In one example, the second conductive layer group 300b and the first conductive layer group 200b may be formed in the same structure and the second insulating layer group 300a and the first insulating layer group 200a may be formed in the same structure.

Referring to FIG. 12K, an insulating layer 304 is formed on the sidewalls 302a of the third opening 302 using a process that is the same as or similar to that described with reference to FIG. 12G. The insulating layer 304 may be used as a gate dielectric (hereinafter, referred to as the "third gate dielectric") of the second cell gate pattern group 300b. The third gate dielectric portion 304 may be formed with the same structure as the second gate dielectric portion 204. In one example, the third gate dielectric portion 304 may be formed in a triple layer structure by sequentially depositing a silicon oxide layer that acts as a blocking barrier, a silicon nitride layer or a silicon oxynitride layer that acts as a charge storage layer, and a silicon oxide layer that acts as a tunnel barrier.

In the deposition process for forming the third gate dielectric portion 304, the third gate dielectric portion 304 may be deposited on the second active bar ACT2 that is exposed by the third opening 302. The third gate dielectric portion that is deposited on the second active bar ACT2 may be removed via etching. A spacer for protecting the third gate dielectric portion 304 deposited on the sidewalls 302a of the third opening 302 from the etching may be formed prior to the etching operation.

Referring to FIG. 12L, a third active bar ACT3 is deposited in the third opening 302 using a process that is the same as or similar to that described with reference to FIG. 12D. The third active bar ACT3 may be connected to the second active bar ACT2 in a vertical direction and to the surface of the semiconductor substrate 100. The third active bar ACT3 may be formed of the same material as the second active bar ACT2. In some embodiments, the third active bar ACT3 may be formed by depositing amorphous or polycrystalline silicon and then planarizing the deposited amorphous or polycrystalline silicon layer through a chemical mechanical polishing (CMP) process, or by epitaxially growing a single crystalline silicon layer from the second active bar ACT2. The third active bar ACT3 may be formed with the same conductivity type as the semiconductor substrate 100, the first active bar ACT1 and the second active bar ACT2, for example, P-type conductivity. In other embodiments, the semiconductor substrate 100, the first, second and third active bars may not be doped with dopants.

Through the foregoing processes, a third structure 301 including the plurality of cell gate patterns 320, 340, 360, 380 on the second structure 201, and the third active bar ACT3 used as a channel of the plurality of cell gate patterns 320, 340, 360, 380 can be formed.

Referring to FIG. 5M, an insulating layer 410, a conductive layer 420, and an insulating layer 430 are sequentially formed on the third structure 301 by, for example, a process that is the same as or similar to that described with reference to FIG. 12A. The insulating layers 410, 430 may be formed by depositing an insulating material such as silicon oxide, silicon nitride, silicon oxynitride or the like. The conductive layer 420 may be used as an upper select gate. The conductive layer 420 (hereinafter, referred to as the "upper select gate") may be formed by depositing a conducive material layer, for example, doped polycrystalline silicon or metal such that the conductive layer 420 can be used as a gate.

Referring to FIG. 12N, a fourth opening 402 that exposes the third active bar ACT3 is formed via a process that is the same as or similar to that described with reference to FIG. 12B. The fourth opening 402 may be formed using, for example, a dry etching process so as to have substantially vertical sidewalls 302.

Referring to FIG. 12O, an insulating layer 404 is formed on sidewalls 402a of the third opening 302 via a process that is the same as or similar to that described with reference to FIG. 12C. The insulating layer 404 may be used as a gate dielectric (hereinafter, referred to as the "fourth gate dielectric") of the upper select gate 420. The fourth gate dielectric 404 may be formed by depositing, for example, a silicon oxide layer. In the deposition process for forming the fourth gate dielectric 404, the silicon oxide layer may be deposited on the third active bar ACT3 that is exposed by the fourth opening 402. The silicon oxide layer deposited on the third active bar ACT3 may be removed using an etching process. In this case, a spacer for protecting the silicon oxide layer that is deposited on the sidewalls 402a of the fourth opening 402 from the etching may be formed prior to the etching step.

Referring to FIG. 12P, a fourth active bar ACT4 is formed in the fourth opening 402 using a process that is the same as or similar to that described with reference to FIG. 12D. The fourth active bar ACT4 may be connected to the third active bar ACT3 in a vertical direction and to the surface of the semiconductor substrate 100. The fourth active bar ACT4 may be formed of the same material as the third active bar ACT3. In some embodiments, the fourth active bar ACT4 may be formed by depositing amorphous or polycrystalline silicon and then planarizing the deposited amorphous or polycrystalline silicon layer through a chemical mechanical polishing (CMP) process. In other embodiments, the fourth active bar ACT4 may be formed by epitaxially growing a single crystalline silicon layer from the third active bar ACT3. The fourth active bar ACT 4 may be formed to have the same conductivity type as the semiconductor substrate 100, for example, P-type conductivity. In other embodiments, the semiconductor substrate 100, the first, second, third and fourth active bars ACT1, ACT2, ACT3 and ACT 4 may not be doped with dopants.

Through the foregoing processes, a fourth structure 401 that includes the upper select gate and the fourth active bar ACT4 (which is used as a channel of the upper select gate) can be formed on the third structure 301. The active bar which is formed on the semiconductor substrate 100 may be formed of the same material (e.g., silicon) as the semiconductor substrate 100, and may have the same conductivity type as the semiconductor substrate 100.

In particular, since the active bar ACT is foamed by separately forming the first to fourth active bars ACT1 to ACT 4, it is possible to minimize a width difference according to height of each of the first to fourth active bars ACT1 to ACT 4. Accordingly, since the width of the active bar ACT can be set to not vary greatly according to its height, deterioration of cell dispersion characteristics can be reduced and/or minimized.

A bit line 610 that is electrically connected to the active bar ACT may be formed on the fourth structure 401. The bit line 610 may be formed to extend in a direction that crosses the upper select gate 420. In one example, the bit line 610 may be formed by depositing an aluminum layer on the fourth structure 401 and then patterning the deposited aluminum layer through a photolithography and etching process.

Additionally, the apparatus and methods described herein may be used in conjunction with lithographic patterning tools or processes, for example, for the fabrication or manufacture of semiconductor devices, displays, LEDs, photovoltaic panels and the like that incorporate stacks as described. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or extreme UV light or an electron beam with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma or wet resist stripper. One embodiment is a method as described herein further including: applying photoresist to the wafer to define the locations of silicon containing stacks; exposing the photoresist to an energy source; patterning the resist and transferring the pattern to the wafer; and selectively removing the photoresist from the wafer. One embodiment is system including an apparatus as described herein further comprising a stepper.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

Experimental

The following section and figures relate the results of two experiments that were performed. In a first experiment, a stack having alternating layers of (a) PECVD deposited oxide and (b) boron doped silicon was deposited to a total stack height of 73 layers. Each layer of oxide was about 200 Å thick, and each layer of boron doped silicon was about 300 Å thick. In a second experiment, the stack consisted of 64 layers alternating between (a) undoped silicon and (b) boron doped silicon. The undoped silicon layers were deposited to a thickness of about 300 Å. The doped silicon layers were deposited to thickness of about 200 Å. On top of the 64 layers of silicon was deposited a 500 Å thick layer of oxide. As shown below in Table 1, the total thicknesses of the stacks in these experiments were about 1.8 µm in the first experiment and about 1.65 µm in the second experiment.

TABLE 1

| Recipes | Stack | |
|---|---|---|
| | Silicon oxide/doped poly-silicon | Undoped/doped poly-silicon |
| Stack structure | 73 total layers with alternating 200 Å thick silicon oxide layers and 300 Å thick doped poly-silicon layers | 65 total layers with alternating 300 Å thick undoped poly-silicon layers and 200 Å thick doped poly-silicon layers with a single 500 Å thick silicon oxide cap |
| Total thickness (Å) | 18,200 | 16,500 |
| As Deposited Bow (µm) | | |
| | −242 | −198 |
| Bow After 60 Second Anneal (µm) | | |
| Anneal at 650° C. | −208 | −136 |

TABLE 1-continued

| Recipes | Stack | |
|---|---|---|
| | Silicon oxide/doped poly-silicon | Undoped/doped poly-silicon |
| Anneal at 750° C. | −17 | +93 |
| Anneal at 850° C. | −33 | −39 |

As shown in Table 1, the as-deposited stacks exhibited significant compressive bow. In the case of the 73-layer oxide-silicon stack, the as-deposited bow was 242 µm compressive. In the case of the 64-layer doped and undoped silicon stack, the as-deposited bow was 198 µm compressive.

The bottom portion of Table 1 illustrates how the bow improved in response to soft annealing conducted at three different temperatures. Each soft anneal was conducted under identical conditions except for the temperature of the soft anneal. For example, each anneal was conducted at 800 Torr with a nitrogen flow rate of 20 standard liters per minute. Further, each of the soft anneals was conducted for 60 seconds at the designated temperature. As shown, anneals at all temperatures resulted in some improvement, but a remarkable advantage was found to have occurred at an anneal temperature of 750° C. In fact, in the case of the doped silicon/undoped silicon stack of the second experiment, the bow went from compressive to tensile. It is believed that this switch occurred because both the doped and undoped silicon layers transitioned from compressive to tensile.

Figure 8:
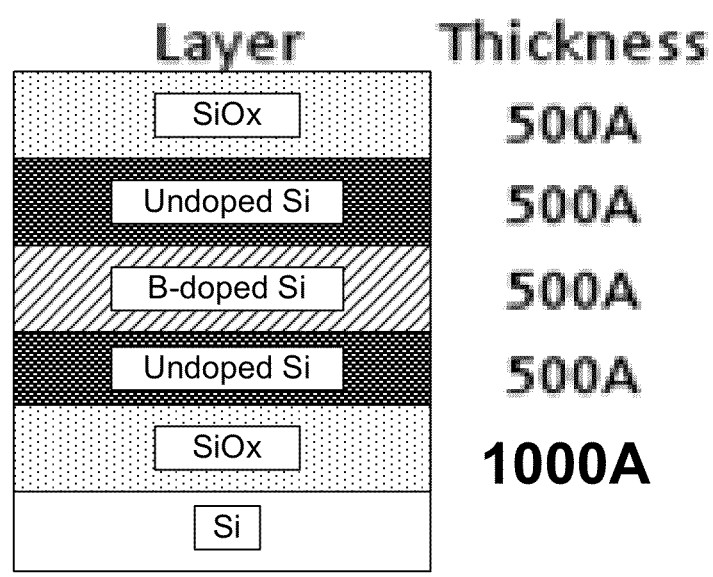
FIG. 8 illustrates a 6 layer stack used in certain experiments herein.

FIGS. 8, 9A-D and 2 depict the effect of the soft anneal on boron migration out of a stack containing a boron doped amorphous silicon layer sandwiched between two undoped amorphous silicon layers, each silicon layer being 500 Å in thickness. Boron is known to have a strong propensity to migrate from doped to undoped silicon when exposed to sufficient thermal energy. The three layer silicon stack is sandwiched between two oxide layers as depicted in FIG. 8. The entire stack was deposited in situ, without any vacuum or temperature breaks between deposition of each of the five depicted layers in the stack.

The five layer stack was annealed at 700° C. for two hours in a furnace. Thereafter, a SIMS analysis was performed on both the as-deposited stack and the annealed stack. FIGS. 9A-9D show the SIMS analysis for the stack both before and after the anneal. In FIGS. 9A-9D, the lines labeled "X1" refer to the concentration of element X before the soft anneal, while the lines labeled "X2" refer to the concentration of element X after the anneal (e.g., line H1 refers to the concentration of hydrogen before annealing). As shown in FIG. 9B, SIMS analysis confirmed that the boron concentration gradient between the doped and undoped layers was essentially unchanged after the anneal.

Figure 9A:
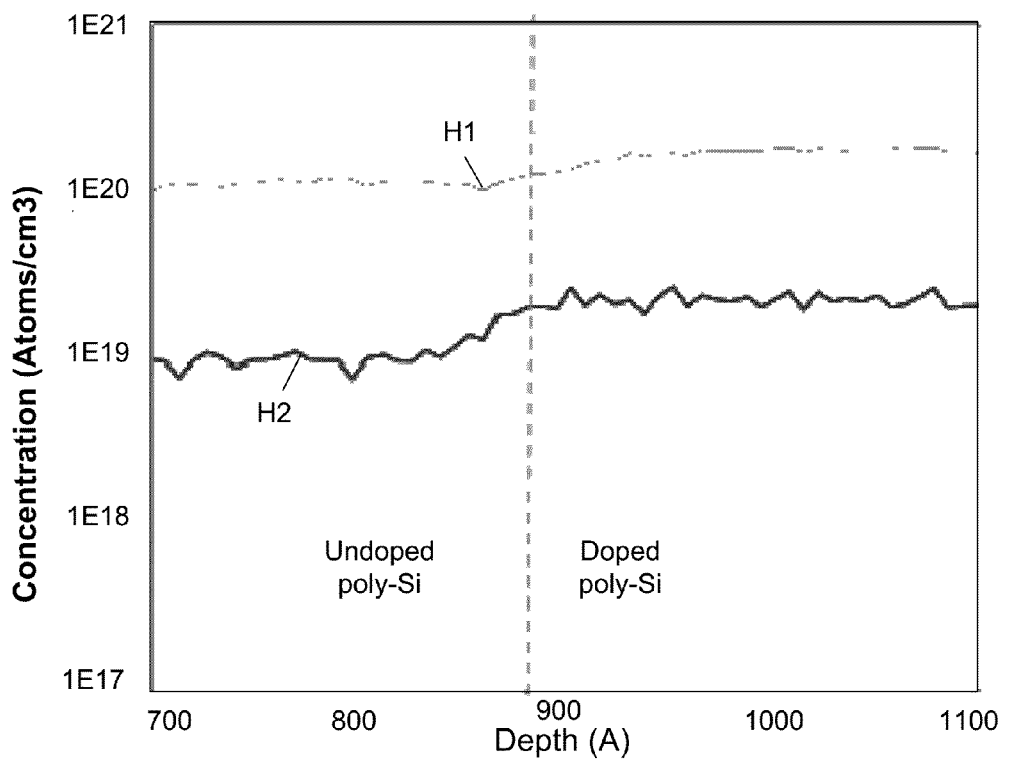
FIGS. 9A-9D shows the concentration profiles for various elements in the stack of FIG. 8 before and after a soft anneal process.
Figure 9B:
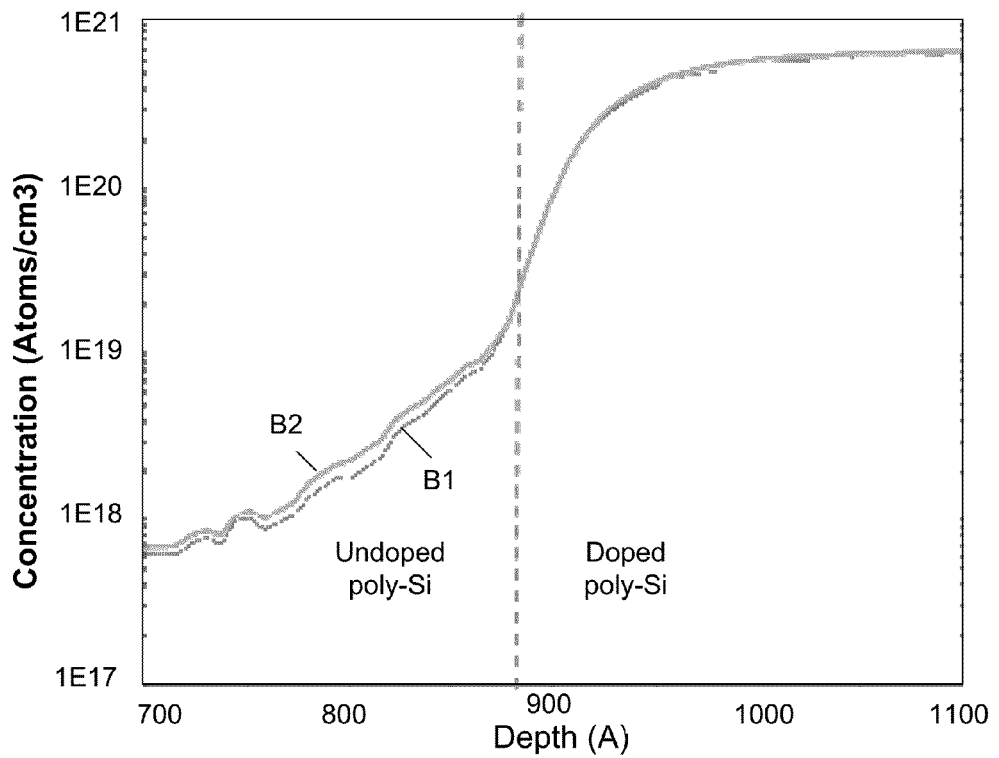
Figure 9C:
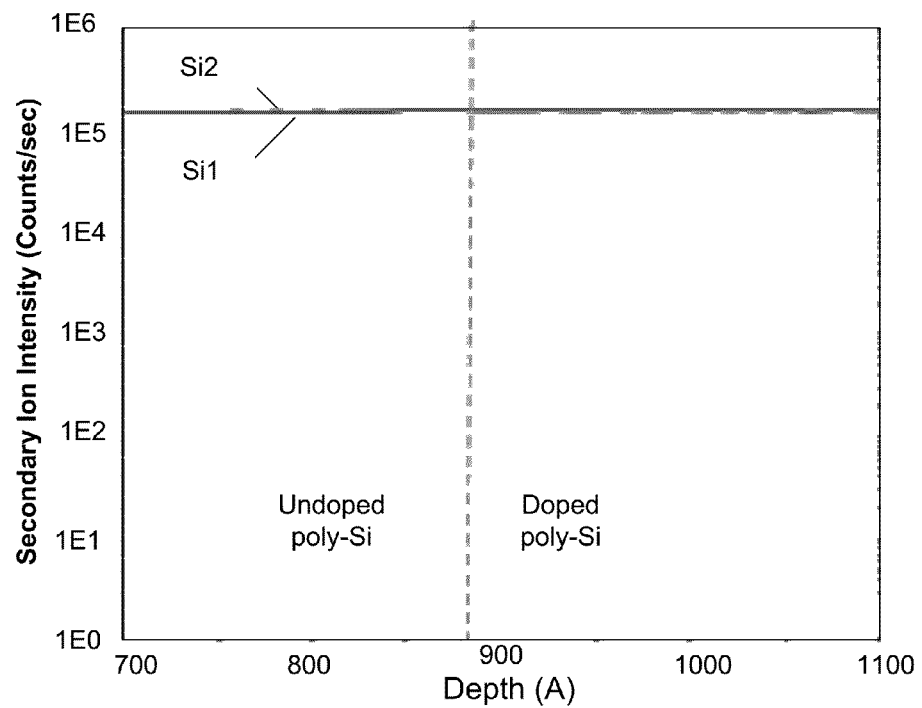
Figure 9D:
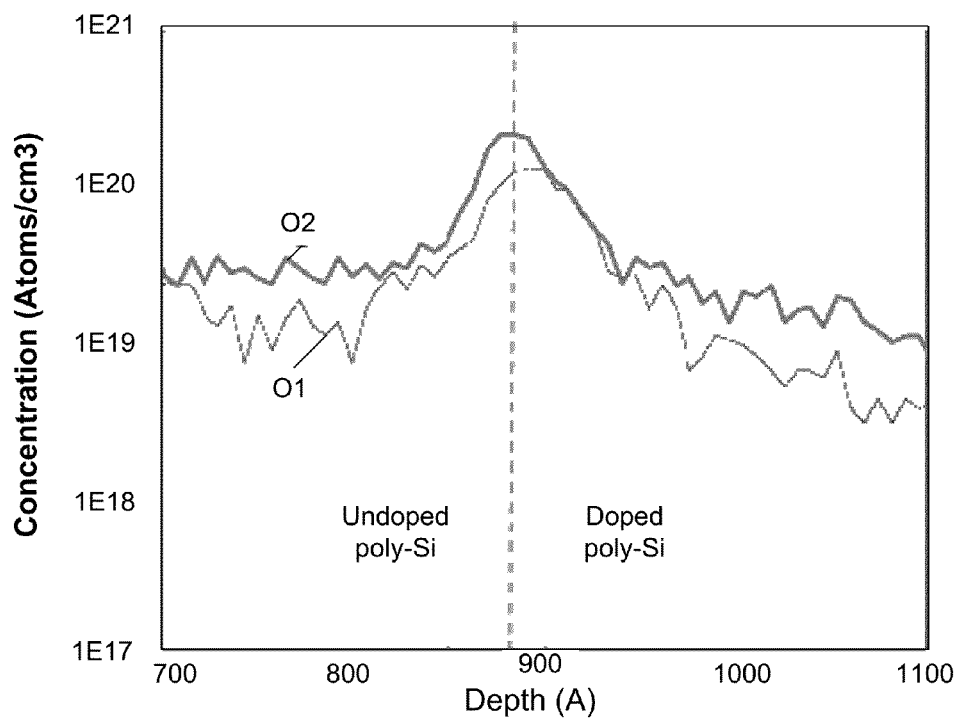

Interestingly, the only change in the composition at the interface was in the level of hydrogen, as shown in FIG. 9A. While not wishing to be bound by any theory, it is believed that the presence of mobile hydrogen may be at least partially responsible for the internal compressive stress of the deposited silicon films. Notably, there is a correlation between reduced hydrogen concentration and reduced compressive bow.

Figure 10:
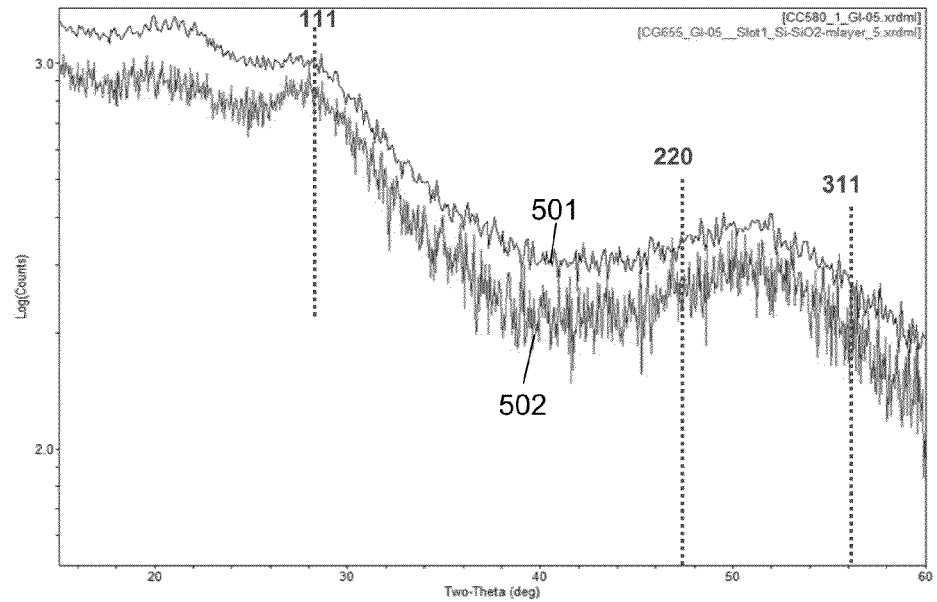
FIG. 10 shows x-ray diffraction data related to the stack of FIG. 8 before and after a soft anneal process.
Figure 11:
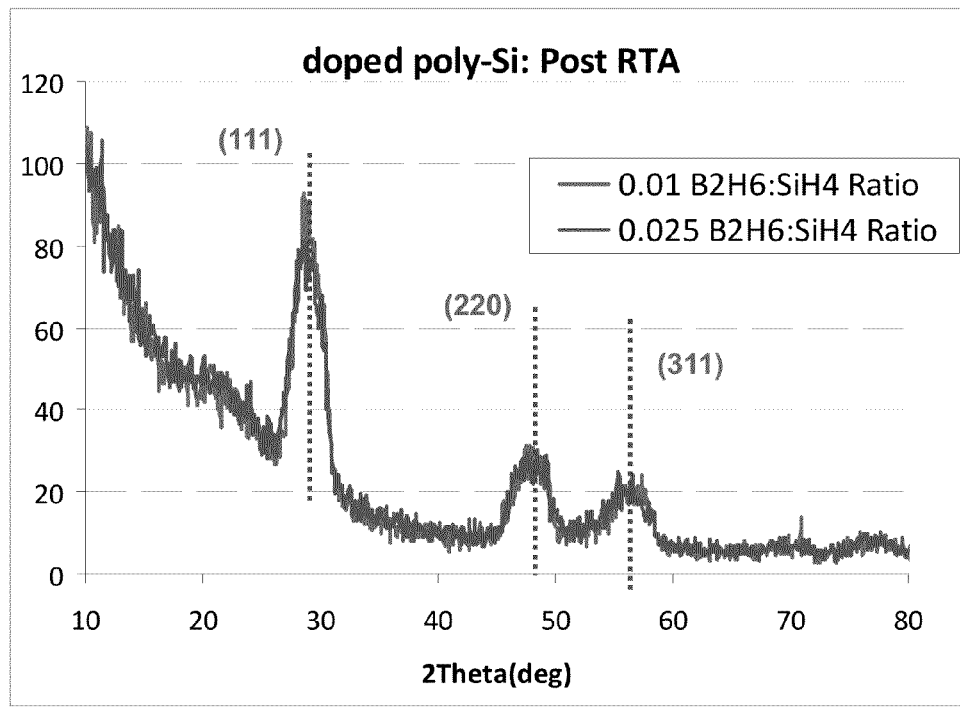
FIG. 11 shows x-ray diffraction data related to activated doped polysilicon.

Next, as shown in FIGS. 10 and 11, the impact of the soft anneal on the crystallinity of the deposited boron doped silicon is analyzed. As shown from the x-ray diffraction data of FIG. 10, there was effectively no measurable change in the crystallinity between the as-deposited (line 501) and annealed (line 502) samples. In both cases, it appeared that there was effectively no measurable crystallinity. For comparison, the x-ray diffraction pattern of silicon after high temperature activation is shown in FIG. 11, and the position of the activated silicon peaks are shown in FIG. 10 (to illustrate their absence in the unactivated, soft annealed sample). Although FIG. 11 includes two sets of data ($B_2H_6$:$SH_4$ ratios of 0.1 and 0.025), these data sets significantly overlap, to the point that it is not possible to separately label the data sets (i.e., the $B_2H_6$:$SH_4$ ratios do not substantially affect the x-ray diffraction pattern of the activated silicon samples). As can be clearly seen in FIG. 11, there are strong peaks associated with certain crystallographic planes of the silicon. These peaks are notably absent in both the as-deposited and post-soft annealed silicon shown in FIG. 10.

What is claimed is:

1. A method of preparing a stack structure for an electronic device on a semiconductor substrate, the method comprising:
    (a) depositing a stack of at least one repeating group, the group having two or more layers, wherein at least two layers in the group comprise different materials, wherein the material of at least one of the layers in the group is unactivated silicon, and wherein the stack comprises at least about four layers, each of substantially similar thickness;
    (b) performing a soft anneal on the stack to reduce internal stress in the stack;
    (c) after (b), patterning the stack by defining a pattern on the stack and vertically etching the stack to impart the pattern to the stack;
    (d) after (c), selectively etching the patterned stack to selectively remove portions of at least one of the different materials in the stack; and
    (e) after (d), activating the silicon in the at least one layer in the group to convert the silicon to a polycrystalline state, wherein the soft anneal is performed under conditions that do not activate the silicon in the at least one layer in the group.

2. The method of claim 1, wherein the stack comprises alternating layers of doped silicon and a dielectric material.

3. The method of claim 1, wherein the stack comprises alternating layers of doped silicon and undoped silicon.

4. The method of claim 1, wherein the silicon deposited in at least one of the layers in the group is amorphous or microcrystalline silicon.

5. The method of claim 1, wherein the stack has a total thickness of between about 1 and 6 micrometers.

6. The method of claim 1, wherein each layer of silicon in the stack has a thickness of between about 10 and 1000 angstroms.

7. The method of claim 1, wherein prior to (b), the internal stress in the stack produces a bow in the semiconductor substrate.

8. The method of claim 7, wherein the bow in the semiconductor substrate is at least about 150 micrometers.

9. The method of claim 1, wherein the soft anneal is conducted under conditions that do not permit more than about $1\times10^{19}$ atoms/cm$^3$ of dopant to diffuse into an undoped silicon layer.

10. The method of claim 1, wherein the soft anneal is conducted at a temperature between about 550° C. and about 750° C. for a duration of between about 1 second and 7 minutes.

11. The method of claim 1, wherein the soft anneal is conducted in a rapid thermal annealing chamber.

12. The method of claim 1, wherein selectively etching the patterned stack is performed by a wet etching process.

13. The method of claim 1, wherein activating the silicon comprises heating the silicon to a temperature of about 750° C. or higher.

14. The method of claim 1, wherein the stack forms a portion of a memory device.

15. The method of claim 14, wherein the memory device is a vertically integrated memory device.

16. The method of claim 1, wherein patterning the stack comprises performing a photolithographic process or an electron beam lithography process.

17. The method of claim 6, wherein the layers in the stack are between about 200-550 angstroms thick.

* * * * *